(12) United States Patent
Sasagawa et al.

(10) Patent No.: US 7,875,506 B2
(45) Date of Patent: Jan. 25, 2011

(54) ETCHING METHOD AND MANUFACTURING METHOD OF SEMICONDUCTOR DEVICE

(75) Inventors: Shinya Sasagawa, Chigasaki (JP); Shigeharu Monoe, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

(21) Appl. No.: 11/663,809

(22) PCT Filed: Oct. 7, 2005

(86) PCT No.: PCT/JP2005/018910
§ 371 (c)(1),
(2), (4) Date: Mar. 26, 2007

(87) PCT Pub. No.: WO2006/041144
PCT Pub. Date: Apr. 20, 2006

(65) Prior Publication Data
US 2007/0264825 A1 Nov. 15, 2007

(30) Foreign Application Priority Data
Oct. 13, 2004 (JP) .............................. 2004-298977

(51) Int. Cl.
*H01L 21/00* (2006.01)
(52) U.S. Cl. ........................ 438/149; 438/618; 438/733; 257/E29.151
(58) Field of Classification Search .................. 438/149, 438/618, 733; 257/E29.151
See application file for complete search history.

(56) References Cited

U.S. PATENT DOCUMENTS

| 6,245,489 | B1 | 6/2001 | Baklanov et al. |
| 6,436,827 | B1* | 8/2002 | Yamazaki et al. ........... 438/688 |
| 6,774,397 | B2 | 8/2004 | Arao et al. |
| 6,844,266 | B2 | 1/2005 | Maex et al. |
| 6,844,267 | B1 | 1/2005 | Vanhaelemeersch et al. |
| 6,900,140 | B2 | 5/2005 | Vanhaelemeersch et al. |
| 6,905,971 | B1 | 6/2005 | Tabery et al. |
| 7,042,091 | B2 | 5/2006 | Baklanov et al. |

(Continued)

FOREIGN PATENT DOCUMENTS

EP      0 911 697      4/1999

(Continued)

OTHER PUBLICATIONS

International Search Report (Application No. PCT/JP2005/018910) dated Jan. 10, 2006.

(Continued)

*Primary Examiner*—Asok K Sarkar
*Assistant Examiner*—Julia Slutsker
(74) *Attorney, Agent, or Firm*—Eric J. Robinson; Robinson Intellectual Property Law Office, P.C.

(57) ABSTRACT

The present invention discloses technique of etching selectively a layer containing siloxane. The present invention provides a semiconductor device with reduced operation deterioration due to etching failure. A method for manufacturing a semiconductor device comprises steps of forming a conductive layer electrically connecting to a transistor, an insulating layer covering the conductive layer, and a mask formed over the insulating layer; and etching the insulating layer with a processing gas including a hydrogen bromide gas.

17 Claims, 14 Drawing Sheets

U.S. PATENT DOCUMENTS

| | | | |
|---|---|---|---|
| 7,091,070 B2 | 8/2006 | Imai et al. | |
| 7,166,894 B2 * | 1/2007 | Templier et al. | 257/347 |
| 2001/0014493 A1 * | 8/2001 | Inoue et al. | 438/149 |
| 2001/0019133 A1 * | 9/2001 | Konuma et al. | 257/79 |
| 2002/0076935 A1 | 6/2002 | Maex et al. | |
| 2002/0117668 A1 * | 8/2002 | Kim | 257/59 |
| 2002/0159016 A1 * | 10/2002 | Nishida et al. | 349/141 |

FOREIGN PATENT DOCUMENTS

| | | |
|---|---|---|
| EP | 1 195 801 | 4/2002 |
| EP | 1 353 364 | 10/2003 |
| EP | 1 050 074 | 2/2004 |
| JP | 2000-150463 | 5/2000 |
| JP | 2001-127040 | 5/2001 |
| JP | 2001-521282 | 11/2001 |
| WO | WO 99/21217 | 4/1999 |

OTHER PUBLICATIONS

Written Opinion (Application No. PCT/JP2005/018910) dated Jan. 10, 2006.

* cited by examiner

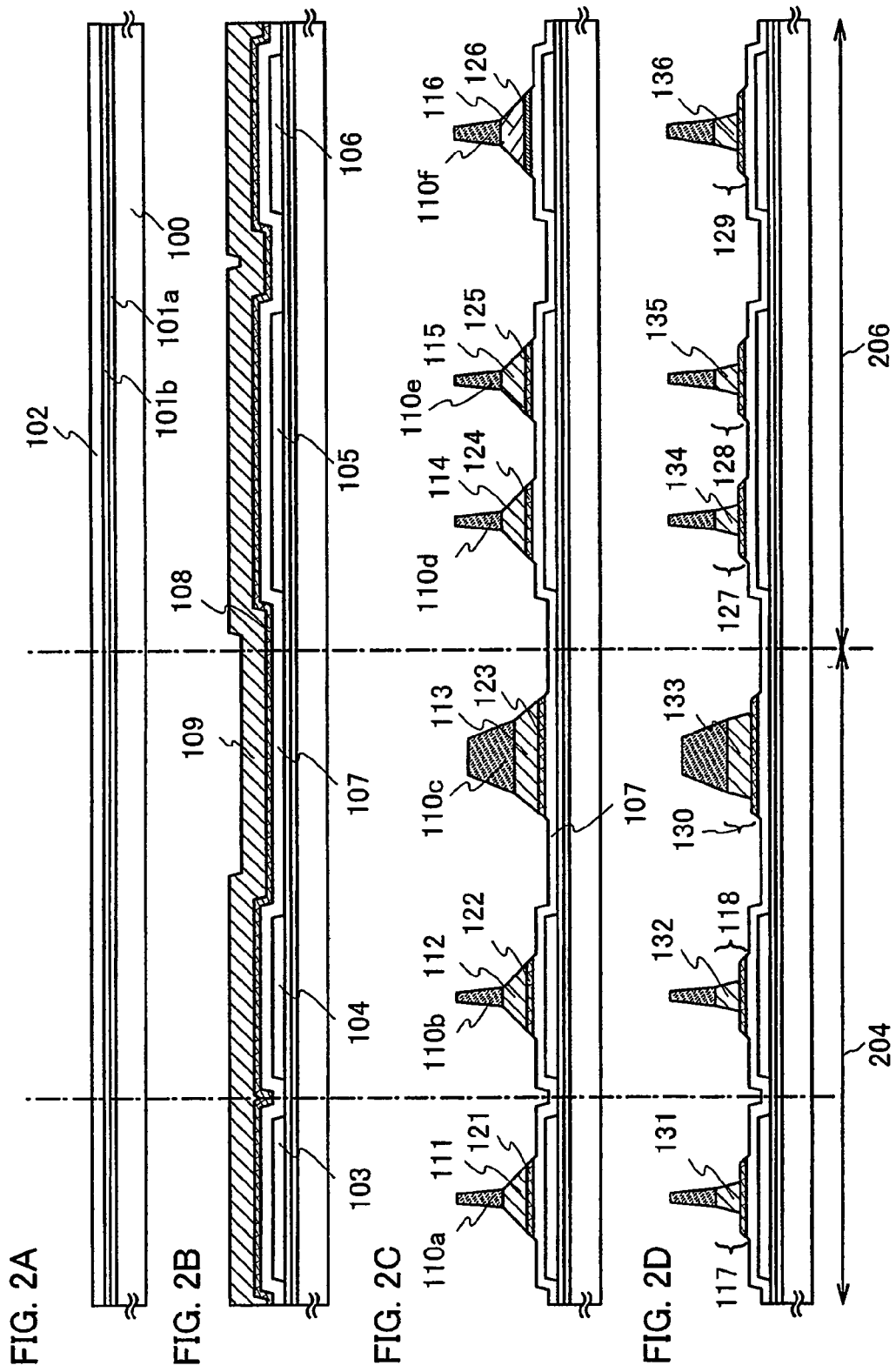

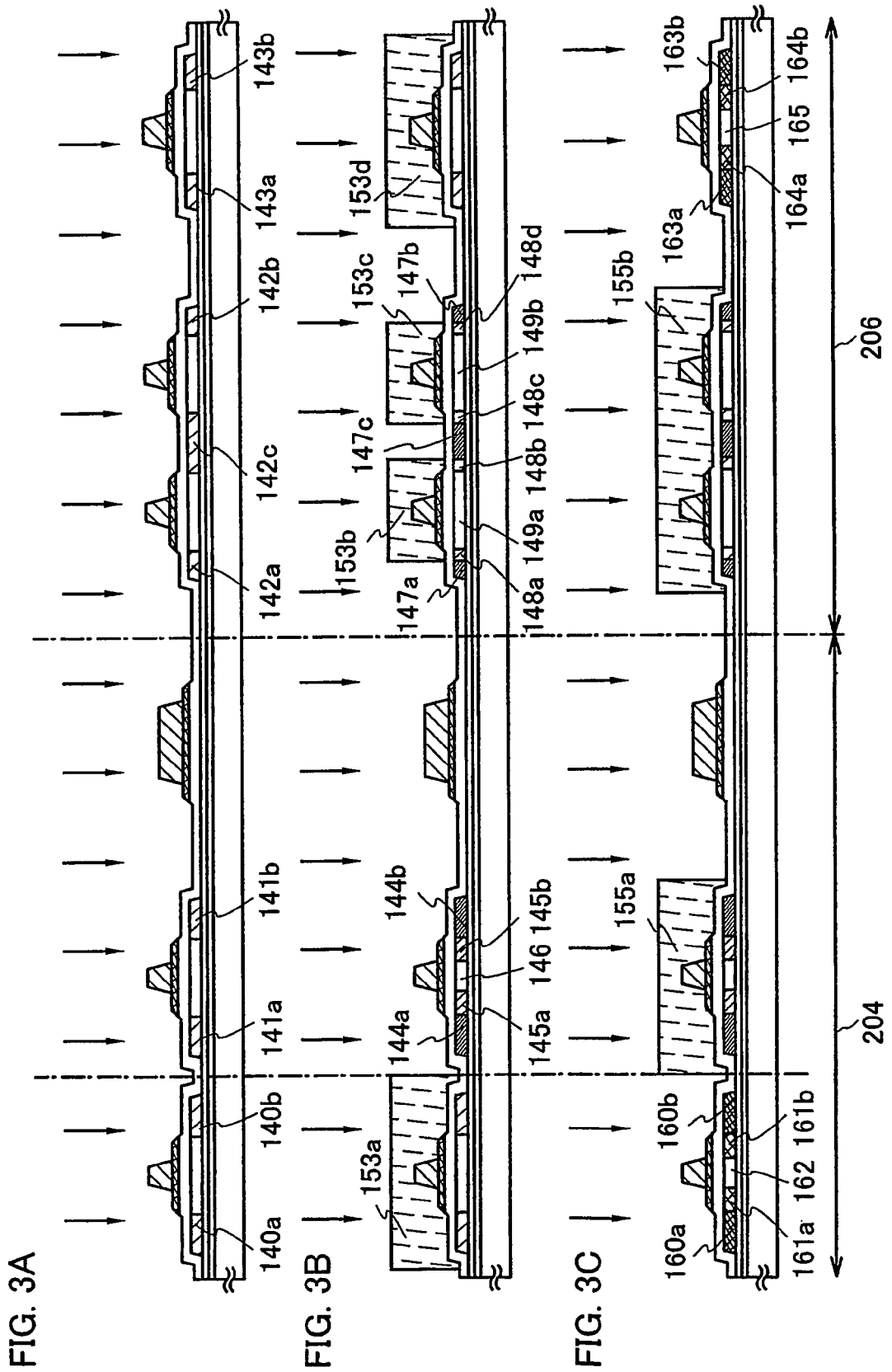

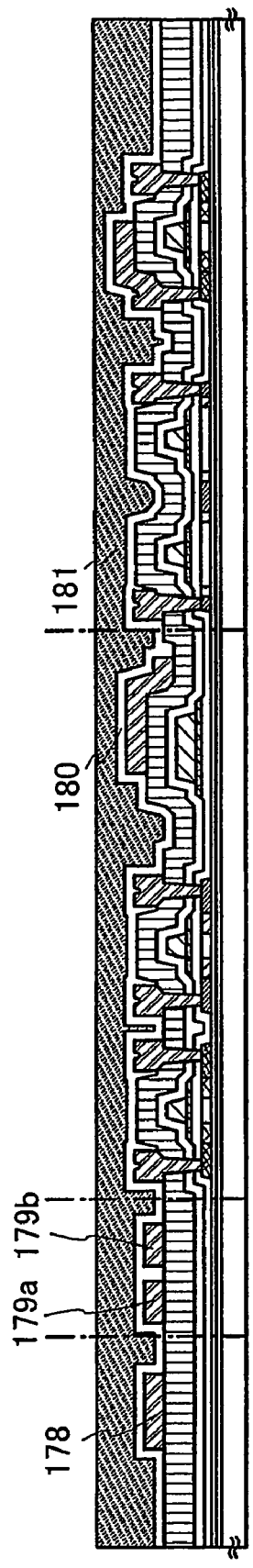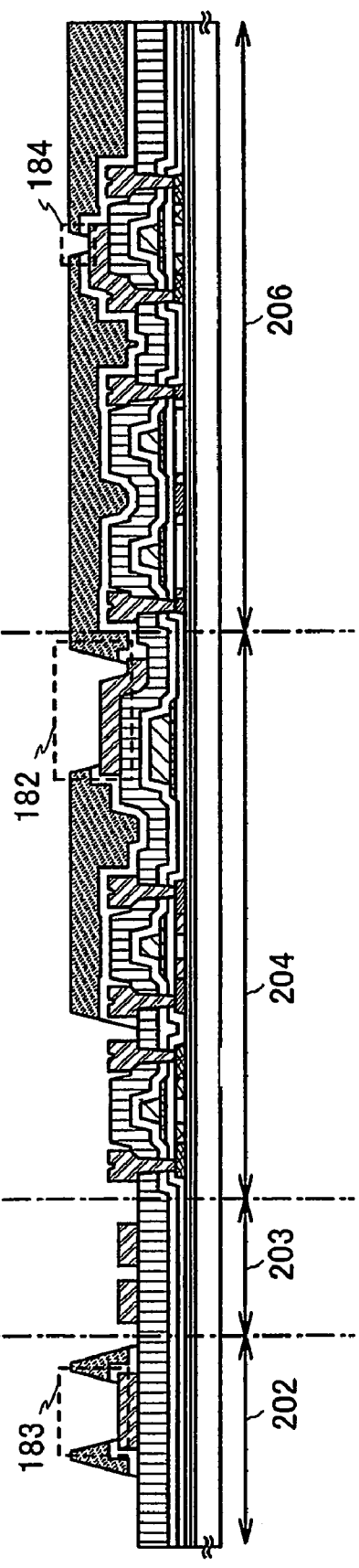
FIG. 5A
FIG. 5B

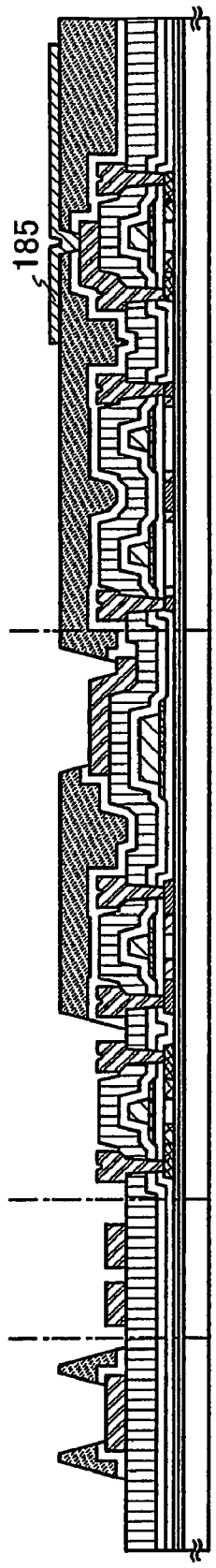
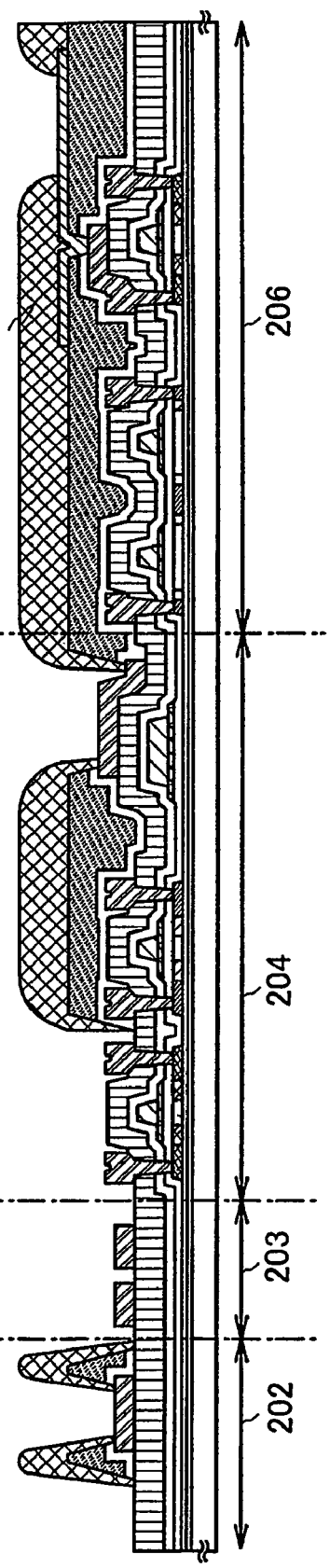
FIG. 6A
FIG. 6B

US 7,875,506 B2

ETCHING METHOD AND MANUFACTURING METHOD OF SEMICONDUCTOR DEVICE

TECHNICAL FIELD

The present invention relates to a method for etching a subject and method for manufacturing a semiconductor device including a structure in which a conductive layer and an insulating layer are laminated.

BACKGROUND ART

A circuit for driving a light-emitting device or a liquid crystal device, an integrated circuit having a function of arithmetic processing, or the like is manufactured by stacking various layers such as a conductive layer, an insulating layer, or a semiconductor layer. Therefore, variations of the height of a surface from a reference surface due to difference in lamination structures, that is, a level difference are produced. When the level difference is increased, it becomes difficult to form a layer for covering the level difference and deterioration such as stepped cut of a wiring may be produced. In the light-emitting device, there may be difference in an emission spectrum of light emission extracted to the outside due to the level difference.

Therefore, technique that a surface is planarized by a chemical mechanical polishing method or the like or a layer is formed by a material having a self-planarization property such as acrylic, polyimide, or siloxane has been developed.

Development of technique for processing a formed layer is required with advance in development of technique for relieving level difference by forming a layer which is planarized its surface. For example, a patent document 1 discloses technique of etching an organic siloxane film by using a processing gas such as $CF_4$, $N_2$, and Ar.

DISCLOSURE OF INVENTION

It is an object of the present invention to provide technique of etching selectively a layer containing siloxane. It is another object of the present invention to provide a semiconductor device with reduced operation deterioration due to etching failure.

A method for manufacturing a semiconductor device comprises a step of etching an insulating layer in a subject having a lamination structure of a conductive layer and the insulating layer with a processing gas including a hydrogen bromide gas.

A method for manufacturing a semiconductor device comprises steps of forming a mask over a subject having a lamination structure of a conductive layer and an insulating layer; and etching the insulating layer with a processing gas including a hydrogen bromide gas.

A method for manufacturing a semiconductor device comprises steps of forming a conductive layer and an insulating layer covering the conductive layer; and etching the insulating layer so that a part of the conductive layer is exposed with a processing gas including a hydrogen bromide gas.

A method for manufacturing a semiconductor device comprises steps of forming a conductive layer electrically connecting to a transistor, an insulating layer covering the conductive layer, and a mask formed over the insulating layer; and etching the insulating layer with a processing gas including a hydrogen bromide gas.

A method for manufacturing a semiconductor device comprises steps of forming a conductive layer electrically connecting to a transistor and an insulating layer covering the conductive layer; and etching the insulating layer so that a part of the conductive layer is exposed with a processing gas including a hydrogen bromide gas.

A light-emitting device according to the present invention has a light-emitting element and a semiconductor device provided to drive the light-emitting element. The semiconductor device is manufactured by a method comprising forming a conductive layer electrically connected to a transistor and an insulating layer for covering the conductive layer and etching selectively the insulating layer so that a part of the conductive layer is exposed. The insulating layer is etched with a processing gas including a hydrogen bromide gas.

By implementing the present invention, an insulating layer containing siloxane can be selectively etched and a lamination of the insulating layer containing siloxane and a conductive layer can be prevented from being over etched. Since the lamination of the insulating layer containing siloxane and a conductive layer can be prevented from being over etched especially when etching the insulating layer containing siloxane, a semiconductor device with reduced operation deterioration due to etching failure can be obtained by implementing the present invention.

BRIEF DESCRIPTION OF DRAWINGS

FIGS. 2A to 2D are explanatory views for showing one embodiment of a manufacturing method of a semiconductor device according to the present invention;

FIGS. 3A to 3C are explanatory views for showing one embodiment of a manufacturing method of a semiconductor device according to the present invention;

FIGS. 5A and 5B are explanatory views for showing one embodiment of a manufacturing method of a semiconductor device according to the present invention;

FIGS. 6A and 6B are explanatory views for showing one embodiment of a manufacturing method of a semiconductor device according to the present invention;

BEST MODE FOR CARRYING OUT THE INVENTION

One embodiment of the present invention will now be described hereinafter. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein.

Embodiment 1

Figure 1A:
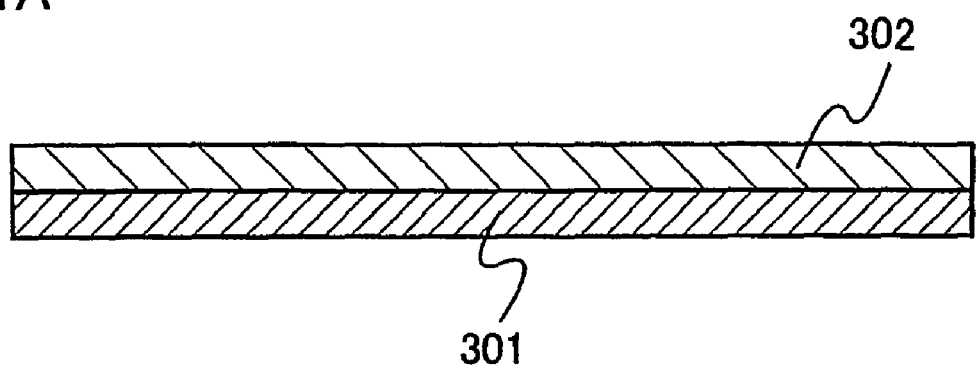
FIGS. 1A and 1B are explanatory views for showing one embodiment according to the present invention.
Figure 1B:
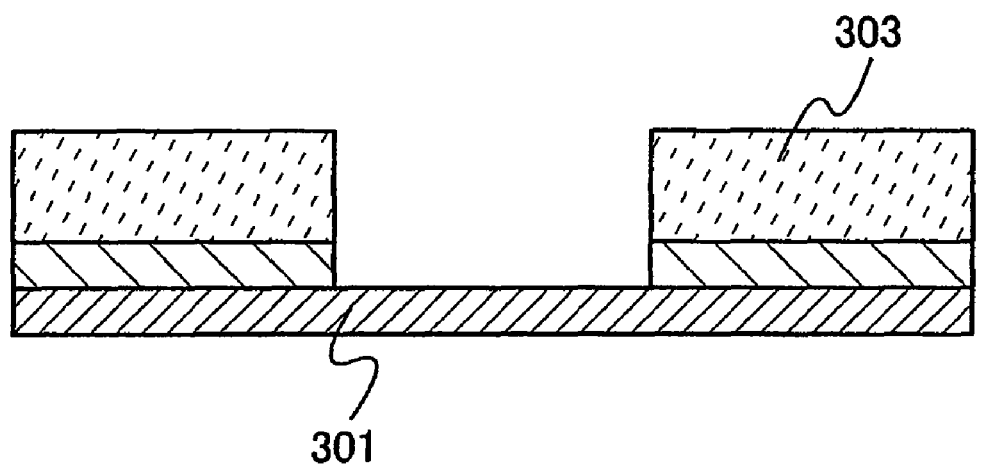

One embodiment of the present invention is explained with reference to FIGS. 1A and 1B.

An etching method according to the present invention includes etching a layer including siloxane with a processing gas containing a hydrogen bromide gas (HBr gas).

Here, siloxane is a compound containing elements such as silicon (Si), oxygen (O), and hydrogen (H) and includes a Si—O—Si bond (siloxane bond). As a specific example of the siloxane, a compound such as cyclic siloxane as represented by the following general formula (2) can be nominated in addition to chain siloxane as represented by the following general formula (1).

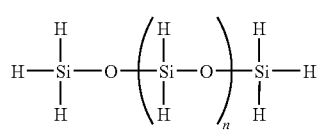

Formula (1)

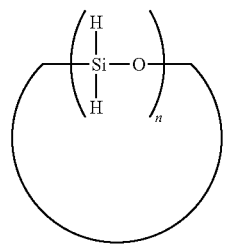

Formula (2)

wherein hydrogen may be substituted by an aryl group or the like such as a phenyl group besides an alkyl group such as a methyl group, and n is a natural number.

As used herein, the term "layer including siloxane" refers to a single layer or a laminated layer including at least one layer formed by using siloxane. A method for forming the layer is not especially limited. The layer may be formed by a method such as an ink-jetting method besides a coating method. After forming the layer including siloxane, heat treatment can be carried out.

With respect to a laminated layer of a conductive layer 301 and an insulating layer including siloxane 302 (FIG. 1A), the insulating layer 302 is selectively etched with a processing gas containing an HBr gas (FIG. 1B), and so it becomes easy to carry out etching in high selective ratio between the conductive layer 301 and the insulating layer 302. That is, the conductive layer 301 can be prevented from being etched excessively along with etching of the insulating layer 302. A mask 303 is provided over the portion of the insulating layer 302 which is not especially required to be etched. The mask 303 is shaped so that the insulating layer 302 is formed into a desired shape. For example, a mask made from resist can be used. Here, the etching method is not especially limited. Besides Inductively Coupled Plasma (ICP), Capacitively Coupled Plasma (CCP), Electron Cyclotron Resonance (ECR), Reactive Ion Etching (RIE), or the like can be used.

The conductive layer 301 is preferably formed by using one or two or more kinds of metal selected from aluminum (Al), molybdenum (Mo), and the like in addition to titanium (Ti). Accordingly, a selective ratio between the conductive layer 301 and the insulating layer 302 becomes higher.

The processing gas preferably includes one or two or more kinds of gases selected from an oxygen gas ($O_2$ gas), carbon tetrafluoride gas ($CF_4$ gas), sulfur hexafluoride ($SF_6$ gas), or the like in addition to the HBr gas. In the case that carbon (C) is included in the insulating layer, carbon can be exhausted as gas such as CO or $CO_2$ by including an $O_2$ gas, and an etching rate can be prevented from lowering due to carbon. By including a $CF_4$ gas, the selective ratio between the conductive layer 301 and the insulating layer 302 becomes higher, which facilitates to etch selectively the insulating layer 302. Further, the HBr gas and the $CF_4$ gas is preferably included in the processing gas so as to be in an HBr/$CF_4$ mixture ratio of 5 to 8. Accordingly, the selective ratio between the conductive layer 301 and the insulating layer 302 becomes higher. Pressure at etching is preferably adjusted to be less than 2 Pa, more preferably, 1.7 Pa or less. By adjusting the pressure, residue due to siloxane is prevented from generating.

The conductive layer 301 and the insulating layer 302 may be a single layer or a laminated layer, respectively. For example, the conductive layer 301 may be a laminated layer of a layer including aluminum and a layer including titanium. The insulating layer 302 may be a laminated layer of a layer including siloxane and a layer including insulator such as silicon oxide.

Embodiment 2

One embodiment of a method for manufacturing a semiconductor device according to the present invention is explained with reference to FIGS. 2 to 6.

An insulating layer 101a is formed over a substrate 100. An insulating layer 101b is formed over the insulating layer 101a. The insulating layer 101a is preferably a layer in which impurities are hardly dispersed, for example, a layer including silicon nitride or silicon nitride containing oxygen is preferably used as the insulating layer 101a. As the insulating layer 101b, a layer which makes stress difference generated between the insulating layer and a semiconductor layer which will be formed in the subsequent process be small is preferably used. For example, a layer including silicon oxide or silicon oxide containing a minute amount of nitrogen is preferably used. A method for forming the insulating layers 101a, 101b is not especially limited; a plasma CVD method, a low pressure CVD method, a sputtering method, a PVD method, or the like can be used. The substrate 100 is not especially limited. A substrate made from an insulator such as glass or quartz, or a substrate provided with an insulating layer made from silicon, SUS, or the like, can be used as the substrate 100. Besides, a substrate made from plastic having flexibility such as polyethylene terephthalate (PET) or polyethylenenaphthalate (OEN) can be used.

Then, a semiconductor layer 102 is formed over the insulating layer 101b. The semiconductor layer 102 is not especially limited. An amorphous semiconductor, a crystal semiconductor, or a semiconductor including both of an amorphous component and a crystalline component can be used. Besides, a semiamorphous semiconductor (SAS) which may be referred to as a microcrystal semiconductor or microcrystal may be used. (FIG. 2A)

The SAS is explained as follows: the SAS has an intermediate structure between an amorphous structure and a crystalline structure (including single crystals and poly crystals). The SAS has a stable third state with respect to free energy, and a crystalline region having a short-range order and lattice distortion. At least a part of the SAS film includes crystal grains with grain diameters of from 0.5 to 20 nm. A raman spectrum is shifted to a lower wave number than 520 cm$^{-1}$. By X-ray diffraction, diffraction peaks (111), (220) that may be derived from a Si crystalline lattice are observed. Hydrogen or halogen of 1 atomic % or more is contained in the SAS as neutralizer for terminating dangling bond. The SAS is formed by glow discharge decomposition (plasma CVD) of a silicide gas. As the silane gas, $Si_2H_6$, $SiH_2Cl_2$, $SiHCl_3$, $SiCl_4$, $SiF_4$, or the like in addition to $SiH_4$ can be used. In addition, $F_2$ and $GeF_4$ can be mixed into the silane gas. The silicide gas can be diluted by $H_2$, or the $H_2$ and one or a plurality of rare gas elements selected from the group consisting of He, Ar, Kr, and Ne. The dilution rate is in the range of from 2 to 1000 times. An applied voltage is in the range of from 0.1 to 133 Pa. A power source frequency is in the range of from 1 to 120 MHz, preferably, 13 to 60 MHz. A substrate heating temperature is at most 300° C., preferably, from 100 to 200° C. As impurity elements in the film, atmospheric constituents such as oxygen, nitrogen, carbon, and the like have preferably density of $1\times10^{20}/cm^{-3}$ or less, especially, oxygen density is $5\times10^{19}/cm^{-3}$ or less, preferably, $1\times10^{19}/cm^{-3}$ or less. By promoting a lattice distortion by adding a rare element such as helium, argon, krypton, or neon, a favorable SAS can be obtained with increased stability. An SAS film formed by using a hydrogen gas can be stacked over an SAS film formed by using fluorine gas as a semiconductor film.

As the amorphous semiconductor, amorphous silicon hydride is typically nominated. As the crystalline semiconductor, polysilicon is typically nominated. The polysilicon includes so-called high-temperature polysilicon which uses polysilicon formed at a process temperature of 800° C. or more as its main component, so-called low-temperature polysilicon which uses polysilicon formed at a process temperature of 600° C. or less as its main component, or polysilicon which is crystallized by adding an element which promotes crystallization.

In the case of using a crystalline semiconductor as a semiconductor layer 102, a method for forming the semiconductor layer is not especially limited. The semiconductor layer can be formed by crystallizing an amorphous semiconductor layer by a crystalline method appropriately selected among a laser crystallization method, a thermal crystallization method, or a thermal crystallization method using a metal element which promotes crystallization such as nickel. In that case, a plurality of crystallization methods can be combined with each other, for example, laser crystallization can be further carried out after performing thermal crystallization. In the case that a substrate which can withstand high temperature is used, the semiconductor layer 102 can be formed by using a deposition method for depositing a crystal semiconductor.

A heating method employed in a thermal crystallization method is not especially limited; a furnace annealing method, a rapid thermal annealing (RTA) method, or the like can be used. The RTA method may be either a gas RTA method utilizing high temperature gas or a lamp RTA method emitting strong light.

A method for introducing a metal element which promotes crystallization is not especially limited. In addition to a method of providing a layer containing a metal element which promotes crystallization over an amorphous semiconductor by a sputtering method or the like, a method of providing a layer containing a metal element which promotes crystallization over an amorphous semiconductor by coating metallic salt solution containing a metal element over the amorphous semiconductor can be used. As the metal element which promotes crystallization, nickel, palladium, or the like can be used. As the metallic salt solution, acetic acid salt solution containing nickel can be nominated.

The laser crystallization method is not especially limited. A laser crystallization method employing one or both of continuous oscillation laser or pulse oscillation laser can be used. A laser medium is not especially limited. Lasers formed by various kinds of laser media such as excimer laser, argon laser, krypton laser, He—Cd laser, YAG laser, $YVO_4$ laser, YLF laser, $YAlO_3$ laser, $Y_2O_3$ laser, glass laser, ruby laser, Ti:sapphire laser, or the like can be used. As continuous oscillation laser, for example, second harmonic wave (532 nm) or third harmonic wave (355 nm) of Nd: $YVO_4$ laser (fundamental wave: 1064 nm) can be nominated. By emitting laser light of second to fourth harmonic waves of a fundamental wave, a crystal with a large grain diameter can be obtained. In the case of using pulse oscillation laser, a semiconductor film having crystal grains grown continuously in a scanning direction can be formed by performing laser crystallization at laser light oscillation frequency of 0.5 MHz or more by using a drastically higher frequency band than a frequency band of several ten Hz to several hundreds Hz typically used.

In the case that much hydrogen is contained in an amorphous semiconductor layer, it is preferable that laser crystallization is carried out after performing heating an amorphous semiconductor layer in gas having low reactivity such as nitrogen so that hydrogen density becomes $1\times10^{29}$ atoms/cm$^3$ or less. Accordingly, damage of the layer which may be generated when using a laser crystallization method can be prevented. Unevenness of the surface of the semiconductor layer can be lowered by performing laser crystallization in an inert atmosphere such as rare gas or nitrogen.

As noted above, the semiconductor layer 102 is formed. In the case that crystallization is carried out with a metal element, a metal element contained in the semiconductor layer 102 is preferably reduced or removed after the crystallization. By reducing or removing the metal element, a transistor showing more favorable characteristics can be obtained. Processing of reducing or removing the metal element contained in the semiconductor layer 102 is referred to as gettering. A method of the gettering is not especially limited; the gettering can be preformed by using the following methods. Firstly, an amorphous semiconductor layer is formed over the semiconductor layer 102, and heat treatment is carried out. The processing temperature for the heat treatment is preferably adjusted so that metal contained in the semiconductor layer 102 can be diffused into the amorphous semiconductor layer. A heating method is not especially limited; furnace, RTA, or the like can be used. RTA is preferably used since heating time can be reduced. The metal element is moved to the amorphous semiconductor layer due to the heating. In that case, a part of the amorphous semiconductor layer may be crystallized. The amorphous semiconductor layer which is made redundant after the heating is removed by etching. At this time, a thin oxide film is preferably formed between the semiconductor layer 102 and the amorphous semiconductor layer. Hence, the amorphous semiconductor layer is facilitated to be selectively etched. The thin oxide film is preferably a film which can easily etched simultaneously with the semiconductor layer 102 and the amorphous semiconductor layer in a high selective ratio. For example, in the case that the semiconductor layer 102 and the amorphous semiconductor layer are both silicon, the thin oxide film is preferably silicon oxide. The amorphous semiconductor layer and the oxide film are preferably etched by wet etching with solution. The amorphous semiconductor layer is preferably etched with solution such as tetramethylammonium hydroxide (TMAH) or choline. Further, the oxide film is preferably etched with solution such as fluorinated acid. Accordingly, etching in high selective ratio can be realized.

An impurity element for imparting conductivity such as boron or phosphorus can be added to the semiconductor layer 102. Accordingly, a threshold value can be adjusted.

Then, the semiconductor layer 102 is processed to form a semiconductor layer 103, a semiconductor layer 104, a semiconductor layer 105, and a semiconductor layer 106 in desired shapes. A processing method is not especially limited; for example, a resist mask may be formed over the semiconductor layer to etch an unnecessary portion of the semiconductor layer 102. An etching method is not especially limited; either of a dry etching method or a wet etching method can be used. A method for forming the resist mask is not especially limited; a method of forming a desired shaped mask by drawing while controlling the timing and position of discharging a droplet such as ink-jetting method can be used.

Then, a gate insulating layer 107 is formed so as to cover the semiconductor layers 103 to 106. The gate insulating layer 107 serves as a gate insulating layer. A method for forming the gate insulating layer 107 is not especially limited; a plasma CVD method, a low pressure CVD method, a sputtering method, a PVD method, or the like can be used. Besides, the gate insulating layer 107 can be formed by oxidizing the surfaces of the semiconductor layers 103 to 106. Further, the gate insulating layer 107 can be formed by using silicon oxide, silicon nitride, silicon oxide containing nitrogen, silicon nitride containing oxygen, or the like. In addition, the gate insulating layer 107 may be either a single layer or a laminated layer composed of different substances.

A first conductive layer 108 is formed over the portion where the gate insulating layer 107 is overlapped with each of the semiconductor layers 103 to 106 so as to be in contact with the gate insulating layer 107. A second conductive layer 109 is formed over the first conductive layer 108. The first conductive layer 108 and the second conductive layer 109 are preferably formed by different conductive materials respectively. The first conductive film 108 is preferably formed by a conductive material which has good adhesiveness for the gate insulating layer 107, for example, titanium nitride, tantalum nitride, titanium, tantalum, or the like is preferably used. The second conductive layer 109 is preferably formed by a conductive material having low electric resistivity, for example, tungsten (W), molybdenum (Mo), aluminum (Al), copper (Cu); or alloy or a metal compound containing the foregoing metal as its main component is used. As the alloy, alloy of aluminum and silicon, alloy of aluminum and neodymium, or the like can be nominated. As the metal compound, tungsten nitride or the like can be nominated. A method for forming the first conductive layer 108 and the second conductive layer 109 is not especially limited; a sputtering method, a vapor deposition method, or the like can be used. (FIG. 2B)

Each of masks 110a, 110b, 110c, 110d, 110e, and 110f is formed over the second conductive layer 109. The first conductive layer 108 and the second conductive layer 109 are etched to form first conductive layers 121 to 126 and second conductive layers 111 to 116 so that these conductive layers have side faces which are slanted off the horizontal of these conductive layers. (FIG. 2C) Second conductive layers 111 to 116 are selectively etched to form second conductive layers 131 to 136 remaining the masks 110a to 110f. In that case, the second conductive layers 131 to 136 are preferably processed by etching under the condition of high anisotropy so that these conductive layers have side faces which are perpendicular to the horizontal of these conductive layers. Accordingly, slanted side faces of the second conductive layers 111 to 116 are removed. Electrodes and connecting portions formed by stacking the second conductive layers 131 to 136 having side faces over the first conductive layers 121 to 126 so as to be inside the first conductive layers 121 to 126. Specifically, an electrode 117 composed of the first conductive layer 121 and the second conductive layer 131, an electrode 118 composed of the first conductive layer 122 and the second conductive layer 132, an electrode 127 composed of the first conductive layer 124 and the second conductive layer 134, an electrode 128 composed of a first conductive layer 125 and the second conductive layer 135, an electrode 129 composed of the first conductive layer 126 and the second conductive layer 136, and a connecting portion 130 composed of the first conductive layer 123 and the second conductive layer 133 are respectively formed. The electrodes 117, 127, 128, and 129 serve as gate electrodes. (FIG. 2D)

A method of dry etching employed for etching each of the conductive layers is not especially limited. Inductive coupling plasma (ICP) is preferably used for the etching. As gas employed for the etching, one or two or more kinds selected among a chlorine gas such as $Cl_2$, $BCl_3$, $SiCl_4$, or $CCl_4$, or a fluorine gas such as $CF_4$, $CF_5$, $SF_6$, or $NF_3$, $O_2$, or Ar can be used.

The masks 110a, 110b, 110c, 110d, and 110f can be formed by forming into desired shapes and by ashing to reduce their sizes. By using such the masks, further miniaturized electrodes can be formed, as a result, a transistor having a short channel length can be obtained. A circuit which operates higher speed can be obtained by manufacturing the transistor having a short channel length.

First n-type impurity regions 140a, 140b, 141a, 141b, 142a, 142b, 142c, 143a, and 143b are formed by adding an impurity element imparting n-type conductivity with the electrodes 117, 118, 127, 128, 129, and the connecting portion 130 as masks. The impurity element imparting n-type conductivity is not especially limited; phosphorus, arsenic, or the like can be used. (FIG. 3A)

A mask 153a covering the semiconductor layer 103, a mask 153d covering the semiconductor layer 106, and the mask 153b and a mask 153c covering a part of the semiconductor layer 105 are formed. Second n-type impurity regions 144a, 144b, 147a, 147b, and 147c, each of which has higher density than that of the first n-type impurity region, and third n-type impurity regions 145a, 145b, 148a, 148b, 148c, and 148d, each of which has the same density as that of the first n-type impurity regions or has lower density than that of the second n-type impurity region are formed by adding an n-type impurity element with the masks 153a, 153b, 153c, 153d, and the second conductive layer 132 as masks. Here, the second n-type impurity regions 147a, 147b, 147c, and 147d are regions which are formed by adding n-type impurity elements to the first n-type impurity regions 142a, 142b, and 142c, respectively. (FIG. 3B)

The masks 153a, 153b, 153c, and 153d are removed and a mask 155a for covering the semiconductor layer 103 and a mask 155b for covering the semiconductor layer 105 are formed. First p-type impurity regions 160a, 160b, 163a, and 163b, and second p-type impurity regions 161a, 161b, 164a, and 164b by adding p-type impurity regions with the masks 155a, 155b, and the electrodes 117, 129 as masks. The second impurity regions 161a, 161b, 164a, and 164b are formed in a self-aligning manner so as to be reflected by the shapes of the electrodes 117, 129 and so as to have low density than that of the first p-type impurity regions 160a, 160b, 163a, and 163b. Here, the impurity elements imparting p-type conductivity is not especially limited; boron or the like can be used. (FIG. 3C)

As noted above, an impurity region serving as a source or a drain is provided, simultaneously, regions 146, 149a, 149b, 162, and 165 provided with channels are provided.

The second n-type impurity regions 144a, 144b, 147a, 147b, and 147c serve as sources or drains of n-channel transistors. The first p-type impurity regions 160a, 160b, 163a, and 163b serve as sources or drains of p-channel transistors. By providing the third n-type impurity regions 145a and 145b, and the second p-type impurity regions 161a, 161b, 164a, and 164b are provided between regions serving as drains and regions serving as channel formation regions, an electric field from drain can be relieved and the transistor can be prevented from deteriorating due to hot carriers. By providing the third n-type impurity regions 148a, 148b, 148c, and 148d between regions serving as drains and regions serving as channel formation regions, the transistor can be prevented from deteriorating due to hot carriers, and off current can be reduced. Hence, a transistor which can relieve an electric field from drain can be manufactured.

A manufacturing method and a structure of the transistor are not limited to those explained in this embodiment. For example, a transistor can be formed to have an LDD structure in which a side wall is provided to a conductive layer serving as a gate electrode. Further, a transistor can be formed to be a multigate transistor having a plurality of gate electrodes or a single gate transistor.

After manufacturing the transistor, processing for activating added impurities is preferably performed. The processing for activation is not especially limited; a furnace, a rapid thermal annealing method, a laser irradiation method, or the like can be used. In the case that impurities are activated by a furnace, a rapid thermal annealing method, or the like, the activation is preferably carried out in a nitrogen gas atmosphere or an inert gas atmosphere in order the gate electrode to be hardly oxidized. In the case that the activation is carried out after forming a first insulating layer 167 as described later, the gate electrode can be prevented from being oxidized more effectively by virtue of first insulating layer 167.

Figure 4A:
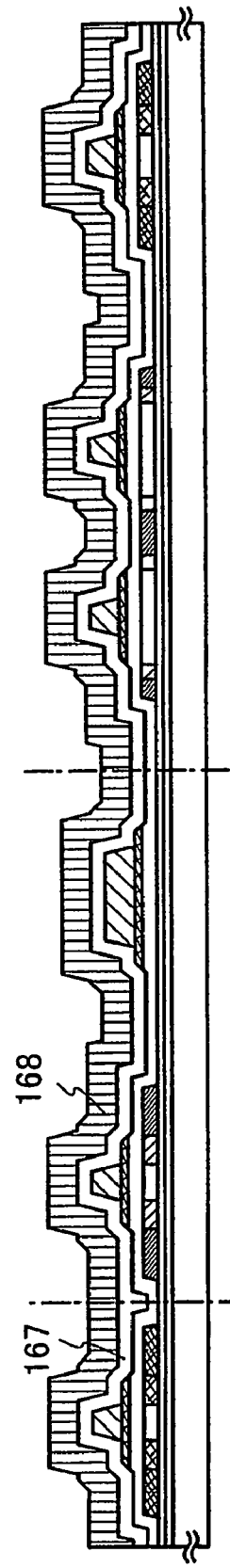
FIGS. 4A and 4B are explanatory views for showing one embodiment of a manufacturing method of a semiconductor device according to the present invention.

The insulating layer 167 is formed so as to cover the transistor. The insulating layer 167 is not especially limited; silicon oxide, silicon nitride, or the like can be used. The silicon oxide can include nitrogen, whereas the silicon nitride can include oxygen. (FIG. 4A)

A second insulating layer 168 is stacked over the insulating layer 167. The second insulating layer 168 is not especially limited; silicon oxide, silicon nitride, or the like can be used. The silicon oxide can contain nitrogen, whereas the silicon nitride can contain oxygen.

Hydrogenation is carried out by heat treatment in a hydrogen atmosphere. By forming the second insulating layer 168 by silicon nitride containing hydrogen, hydrogen treatment can be carried out utilizing hydrogen contained in the second insulating layer 168. In that case, the heat treatment is not necessarily carried out in hydrogen atmosphere; the heat treatment may be carried out in a nitrogen gas atmosphere or an inert gas atmosphere. The silicon nitride containing hydrogen is obtained by depositing by a plasma CVD method with a silane gas, an ammonia gas, and a nitrous oxide gas. Heat treatment temperature in this process is preferably set from 350 to 500° C. The heat treatment can terminate a dangling bond included in the semiconductor layer by hydrogen.

Opening portions which reach to regions serving as sources or drains of the semiconductor layers 103, 104, 105, and 106 are formed penetrating through the first insulating layer 167, the second insulating layer 168, and the gate insulating layer 107. The opening portions can be formed by etching selectively a portion which is intended to have the opening portion with a mask made from resist. The etching method is not especially limited; either or both of a dry etching method or a wet etching method. Gas or solution employed for the etching is not especially limited; gas or solution may be appropriately selected so that etching can be performed in a favorable selective ratio.

Figure 4B:
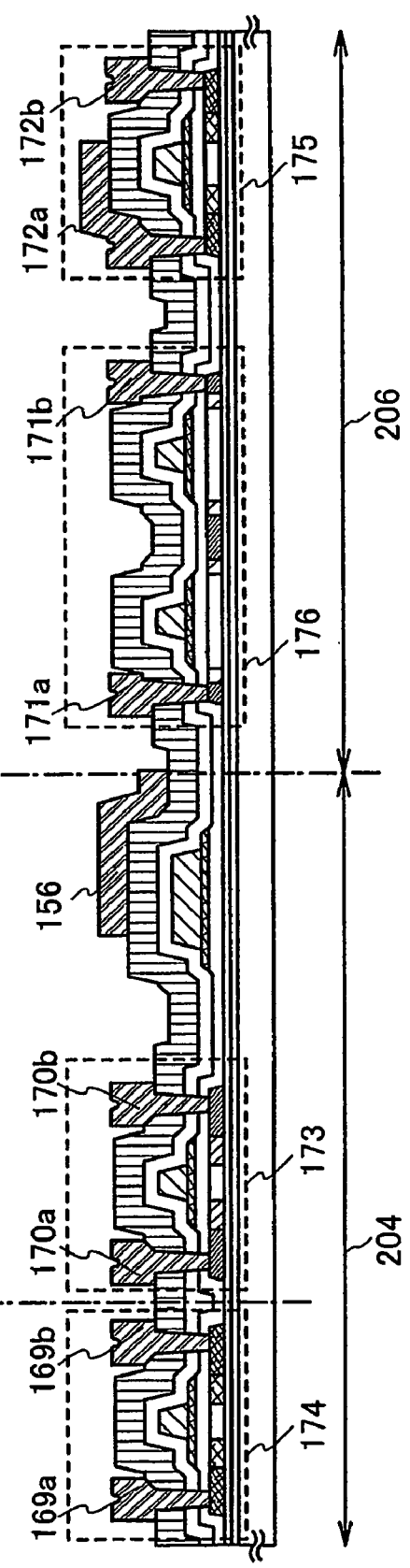

A conductive layer is formed so as to cover the opening portions. Connecting portions 169a, 169b, 170a, 170b, 171a, 171b, 172a, and 172b, each of which is electrically connected to regions serving as sources or drains, are formed by etching the conductive layer, simultaneously, a wiring 156 for sending a electric signal to a source or a drain is formed. A method for forming the connecting portions 169a, 169b, 170a, 170b, 171a, 171b, 172a, and 172b, and the wiring 156 is not especially limited; they can be formed by forming and etching a conductive layer, alternatively, they can be formed by forming selectively the conductive layer in a predetermined position while adjusting the timing and position of discharging a droplet as mentioned above. Besides, an electroplating method, a printing method, a reflow method, a damocene method, or the like can be used. A material for forming the conductive layer is not especially limited; aluminum, molybdenum, titanium, alloy containing the foregoing metal, for example, aluminum containing several percents of silicon, or the like, is preferably used. Specifically, a single conductive layer including a material having low resistivity such as aluminum or molybdenum, a laminated conductive layer composed of a layer including aluminum, molybdenum, or the like and a layer including titanium, or the like are preferably used as the conductive layer. Simultaneously forming the wiring 156, a connecting portion 178 is formed in an external connection region 202 and wirings 179a, 179b are formed in a wiring region 203. (FIG. 4B)

Then, a third insulating layer 180 and a fourth insulating layer 181 are formed so as to cover the connecting portion and the wirings. The third insulating layer 180 is preferably formed by silicon oxide. Accordingly, short circuit between wirings which are formed over separate layers and between electrodes which are formed over separate layers via the third insulating layer 180 and the fourth insulating layer 181 can be prevented more effectively. The fourth insulating layer 181 is preferably made from siloxane, since siloxane has a high self-planarization property (that is, the surface of siloxane is easily be planarized) and higher heat resistance than that of a resin material such as acrylic. A method for forming the third insulating layer 180 is not especially limited; a coating method or the like can be used. (FIG. 5A)

An opening portion 184 reaching to the connecting portion 172a penetrating through the third insulating layer 180 and the fourth insulating layer 181, an opening portion 182 reaching to the wiring 156, and the opening portion 183 are formed, simultaneously, the third insulating layer 180 is etched to expose the wirings 179a, 179b. At this time, the connecting portion which connects to the source or the drain of the transistor provided to a driver circuit region 204 can be exposed. The etching is preferably carried out with a processing gas including HBr gas. By this etching, the third insulating layer 180 and the fourth insulating layer 181 can be selectively etched in a high selective ratio between these insulating layers and the conductive layers which forms the connecting portions 169a, 169b, 170a, 170b, 171a, 171b, 172a, and 172b and the wiring 156. An etching rate of the opening portions 182, 183, and 184 and that of the driver circuit region 204 are different depending on an area or a portion to be etched, and so any of the opening portions or the driver circuit region 204 may be over etched. According to this embodiment, deterioration due to the over etching can be reduced. Besides the HBr gas, and oxygen gas ($O_2$ gas), a carbon tetrafluoride gas ($CF_4$ gas), or the like are preferably included in the processing gas. Accordingly, a selective ratio between the conductive layer and the third insulating layer 180 becomes high. Among all, $CF_4$ gas is preferably included in the processing gas. By including the $CF_4$ gas in the processing gas, the wiring 156, the connecting portion 172a, and the wirings 179a, 179b can be more effectively prevented from being over etched. From etching the fourth insulating layer down to etching the third insulating layer 180, a chlorine gas can be included in addition to the HBr gas. Therefore, an etching rate can be adjusted to be increased, and processing efficiency is improved. An etching method is not especially limited. Capacitively Coupled Plasma (CCP), Electron Cyclotron Resonance (ECR), Reactive Ion Etching (RIE), or the like can be used besides Inductively Coupled Plasma (ICP). (FIG. 5B)

In this embodiment, a semiconductor device including transistors 173, 174 in the driver circuit region 204 and transistors 175, 176 in the pixel region 206 can be obtained. The semiconductor device obtained by this means can be used as an active matrix substrate for driving a light-emitting element or a liquid crystal element.

Figure 7:
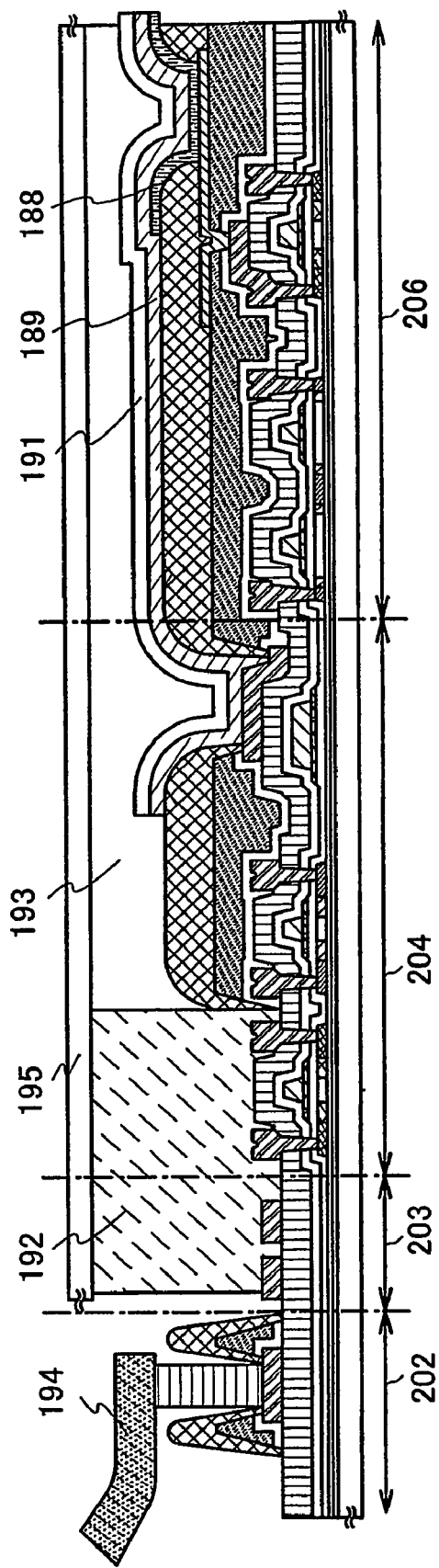
FIG. 7 is an explanatory view for showing one embodiment of a manufacturing method of a semiconductor device according to the present invention.

In this embodiment, one mode of a light-emitting device using the semiconductor device obtained by this means is explained hereinafter with reference to FIG. 6 and FIG. 7.

An electrode 185 electrically connected to the first p-type impurity region 163a of the transistor 176 via the connecting portion 172a is formed. The electrode 185 can be formed by forming a conductive layer covering the opening portion 184 and etching the conductive layer into a desired shape. (FIG. 6A)

A bank layer 186 having opening portions so as to expose a part of the electrode 185, the wiring 156, the connecting portions 178, 170a, and 170b, the wirings 179a and 179b. The bank layer 186 is not especially limited; an organic material such as acrylic, polyimide, or resist, an inorganic material such as silicon oxide, silicon nitride, aluminum nitride, or diamond like carbon (DLC), siloxane, or the like can be used. (FIG. 6B)

A light-emitting layer 188 is formed so as to stack over the electrode 185 which is exposed from the opening portion of the bank layer 186. The light-emitting layer 188 contains a light-emitting material. The light-emitting layer 188 is not especially limited; the light-emitting layer 188 can include either an organic material or an inorganic material, or both the organic material or the inorganic material. The light-emitting layer 188 may be a single layer or a laminated layer. The light-emitting material may emit either fluorescence or phosphorescence.

An electrode 189 is stacked over the light-emitting layer 188. Here, either or both of the electrodes 185, 189 are preferably made from a conductive material which can transmit visible light. Accordingly, a light-emitting element which can emit light from either electrode or both electrodes can be obtained. As the conductive material which can transmit visible light, for example, indium tin oxide, indium tin oxide containing silicon, zinc oxide, or the like can be nominated. Besides the conductive material which can transmit visible light, metal which hardly transmits visible light such as aluminum, silver, gold, tungsten, or molybdenum, and alloy of the foregoing metal such as aluminum containing lithium or silver containing magnesium can be used.

A protective layer 191 is formed so as to cover the light-emitting element which is formed by interposing the light-emitting layer 188 between the electrodes 185, 189. The protective layer 191 is preferably formed by a material having low moisture permeability, for example, silicon nitride or the like can be used. In the case of emitting light from the electrode 189, the electrode 189 is preferably made from a material having a better light-transmitting property. The light-emitting layer 188 can be formed into a plurality of light-emitting layers according to colors which are hoped to be emitted. For example, in the case of emitting each three color of red, blue, and green, a light-emitting layer exhibiting red emission, a light-emitting layer exhibiting blue emission, and a light-emitting layer exhibiting green emission are appropriately formed separately. In addition, desired color emission can be obtained by color conversion of light emission obtained from a light-emitting layer by a filter.

The substrate 100 and a substrate 195 are pasted to each other with a sealant 192 so as to seal in the transistor and the light-emitting layer. In that case, the region 193 surrounded by the substrate 100, the substrate 195, and the sealant 192 are preferably filled with a nitrogen gas, an inert gas, a resin material having low permeability. Accordingly, the light-emitting element can be prevented from being deteriorated due to moisture. Here, the sealant 192 can be provided over the wiring region 203. Further, the external connection region 202 is exposed to the outside to connect electrically the connecting portion 178 to a flexible printed wiring circuit 194. (FIG. 7)

As noted above, an active matrix driving light-emitting device can be manufactured.

In the light-emitting device manufactured according to this embodiment, transistors which have the same cross-sectional structures as those of the transistors 175, 176 are arranged in rows and columns. The light-emitting element is driven depending on supplied current from the transistor 175 to exhibit desired color emission.

Embodiment 3

Since a semiconductor device according to the present invention is manufactured by an etching method in a high selective ratio, a light-emitting device or a liquid crystal display device hardly has deterioration due to etching failure can be manufactured.

In this embodiment, a circuit structure of a light-emitting device having a display function and its driving method are explained with reference to FIGS. 8 to 11. The light-emitting device according to this embodiment includes a circuit for active matrix driving manufactured by applying a manufacturing method of the semiconductor device according to the present invention as explained in Embodiment 1. The circuit structure and the driving method are not limited to those explained here.

Figure 8:
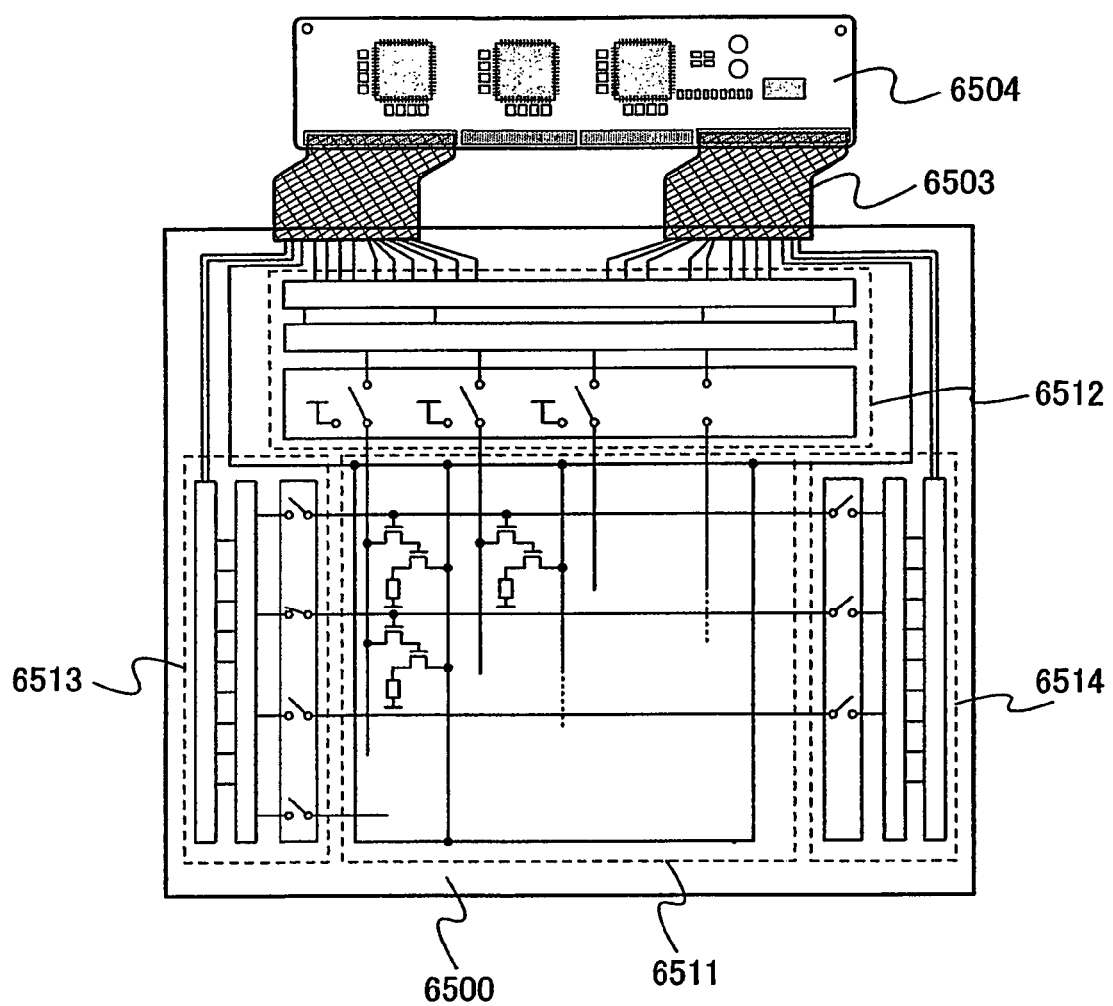
FIG. 8 is an explanatory view for showing one embodiment of a light-emitting device to which the present invention is applied.

FIG. 8 is a schematic view for showing a top view of a light-emitting device applied with the present invention. In FIG. 8, a pixel portion 6511, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 are respectively connected to an FPC (flexible printed circuit) 6513 which is an external input terminal via wiring groups. The source signal line driver circuit 6512, the writing gate signal line driver circuit 6513, and the erasing gate signal line driver circuit 6514 receive respectively a video signal, a clock signal, a start signal, a reset signal, or the like from the FPC 6503. The FPC 6503 is mounted with a printed wiring board (PWB) 6504. The driving circuit portion does not necessarily share one substrate with the pixel portion 6511 as mentioned above. For example, the driving circuit portion can be formed at the outside of the substrate by utilizing a TCP or the like which is formed by mounting an IC chip over an FPC provided with a wiring pattern.

A plurality of source signal lines are arranged in rows in the pixel portion 6511. Further, current supply lines are arranged in rows. A plurality of gate signal lines in lines are arranged in lines in the pixel portion 6511. A plurality of pairs of circuits including light-emitting elements is arranged in the pixel portion 6511.

Figure 9:
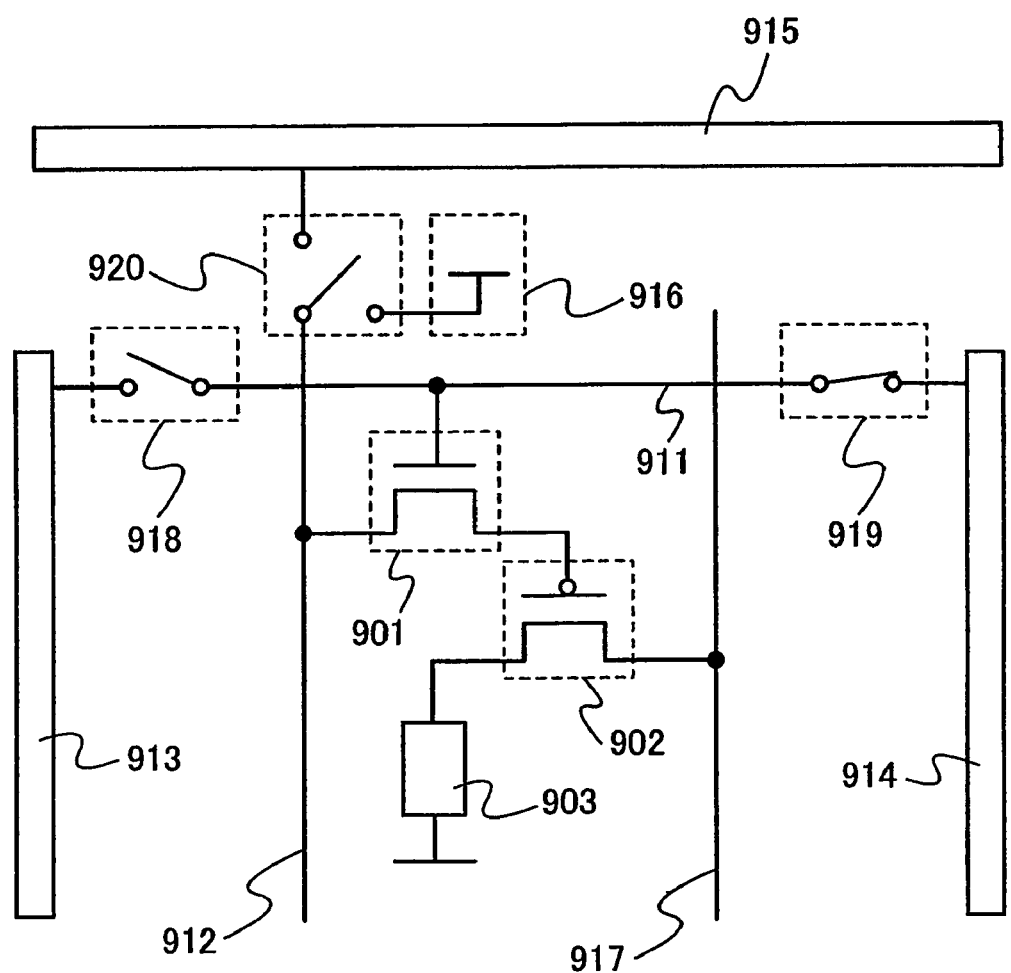
FIG. 9 is an explanatory view for showing a circuit included in a light-emitting device to which the present invention is applied.

FIG. 9 is a view for showing a circuit for operating one pixel. The circuit shown in FIG. 9 includes a first transistor 901, a second transistor 902, and a light-emitting element 903.

The first transistor 901 and the second transistor 902 are three-terminal elements respectively including a gate electrode, a drain region, and a source region. A channel region is interposed between the drain region and the source region. Since the source region and the drain region is changed to each other depending on the structure of a transistor, an operating condition, or the like, it is difficult to determine which region is the source region or the drain region. In this embodiment, regions serving as a source or a drain are respectively denoted by a first electrode and a second electrode.

A gate signal line 911 and a writing gate signal line driver circuit 913 are electrically connected or not connected by a switch 918. The gate signal line 911 and an erasing gate signal line driver circuit 914 are electrically connected or not connected by a switch 919. A source signal line 912 is electrically connected to a source signal line driver circuit 915 or a power source 916 by a switch 920. A gate of the first transistor is electrically connected to the gate signal line 911. A first electrode of the first transistor is electrically connected to the source signal line 912, whereas a second electrode of the first transistor is electrically connected to a gate electrode of the second transistor 902. A first electrode of the second transistor 902 is electrically connected to a current supply line 917, whereas a second electrode of the second transistor 902 is electrically connected to one electrode included in the light-emitting element 903. The switch 918 can be included in the writing gate signal line driver circuit 913. The switch 919 can be included in the erasing gate signal line driver circuit 914. The switch 920 can be included in the source signal line driver circuit 915.

Figure 10:
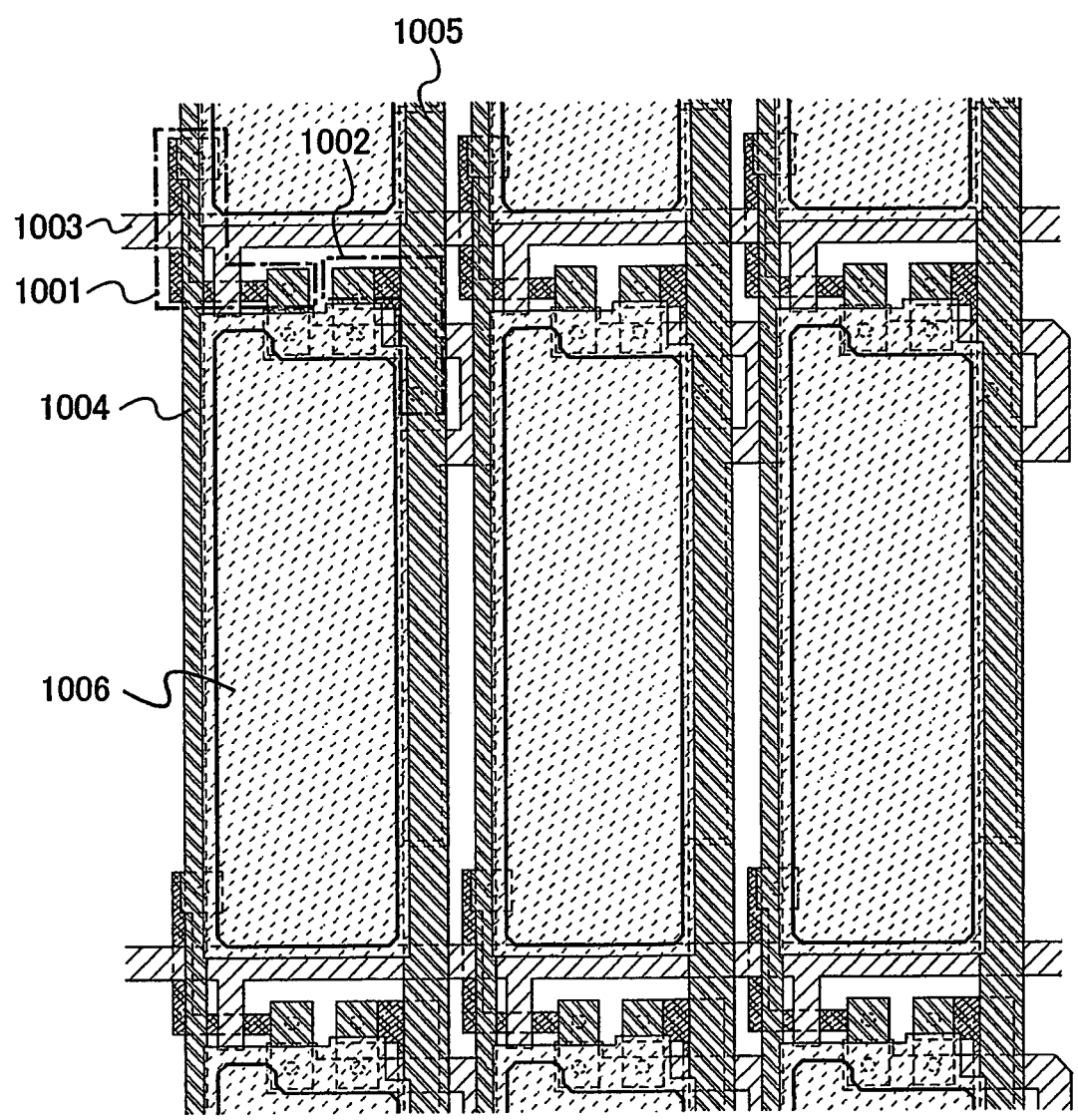
FIG. 10 is an explanatory view for showing one embodiment of a light-emitting device to which the present invention is applied.

Arrangement of the transistor, the light-emitting element, or the like in the pixel portion is not especially limited. For example, they can be arranged as illustrated in a top view of FIG. 10. In FIG. 10, a first electrode of a first transistor 1001 is connected to a source signal line 1004, whereas a second electrode of the first transistor 1001 is connected to a gate electrode 1004 of a second transistor 1002. A first electrode of a second transistor is connected to a current supply line 1005, whereas a second electrode of the second transistor is connected to an electrode 1006 of a light-emitting element. A part of the gate signal line 1003 serves as a gate electrode of the first transistor 1001.

Figure 11:
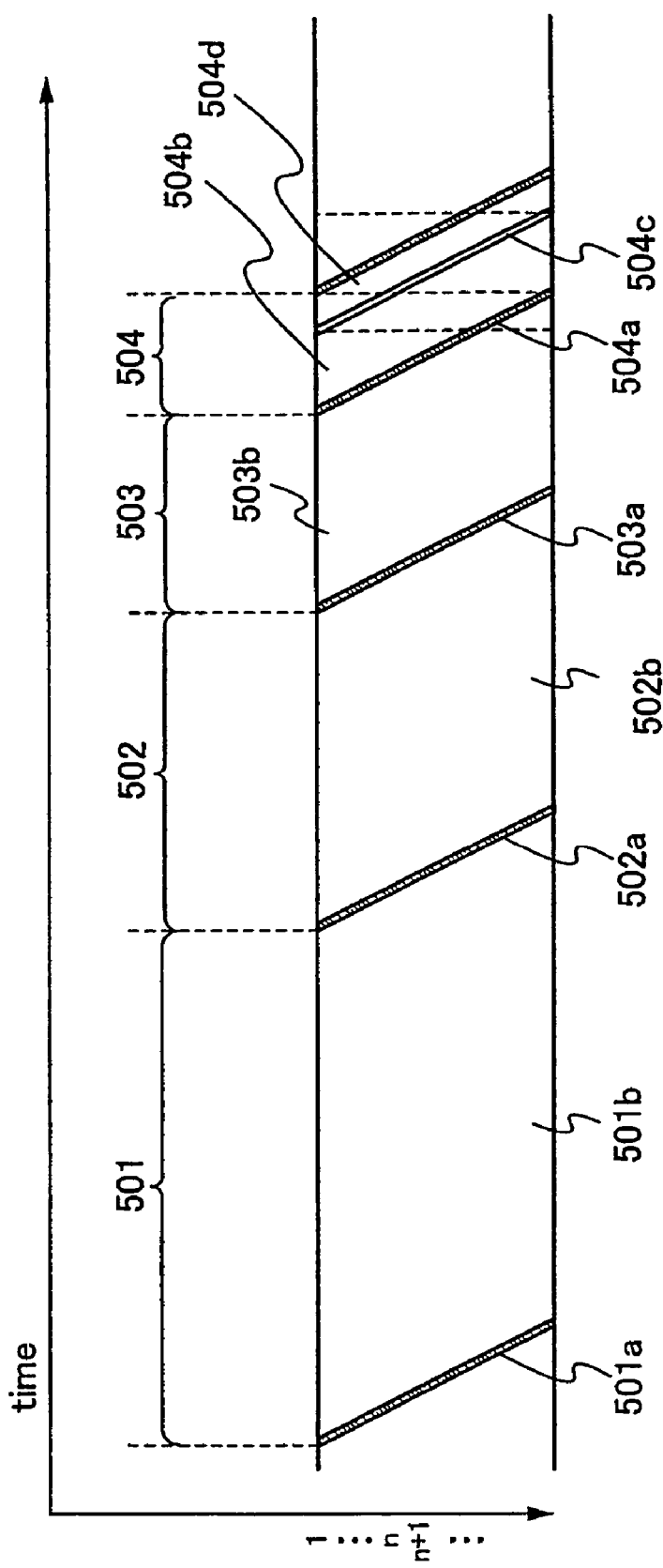
FIG. 11 is an explanatory view for showing one embodiment of a frame operation of a light-emitting device to which the present invention is applied.

A driving method is explained. FIG. 11 is an explanatory view for showing an operation of a frame with time. In FIG. 11, a crosswise direction represents time proceeding, whereas a lengthwise direction represents the number of scanning stages of the gate signal line.

When image display is performed by using the light-emitting device according to the present invention, a rewrite operation and a display operation of a screen are repeatedly carried out. The number of rewrite operations is not especially limited. The rewrite operation is preferably carried out at least at approximately 60 times per one second so that a person who views the image does not feel a flicker. Here, a period in which the rewrite operation and the display operation of one screen (one frame) is referred to as one frame period.

As shown in FIG. 11, one frame is time-divided into four sub-frames 501, 502, 503, and 504 respectively including writing periods 501$a$, 502$a$, 503$a$, and 504$a$ and retention periods 501$b$, 502$b$, 503$b$, and 504$b$. In the retention period, a light-emitting element which is given a signal for emitting light is made to be into an emitting state. The ratio of the length of the retention period in each sub-frame is first sub-frame 501: second sub-frame 502: third sub-frame 503: fourth sub-frame 504=$2^3$: $2^2$: $2^1$: $2^0$=8:4:2:1. This makes possible 4-bit gradation. However, the number of bits or the number of gradations is not limited to that described here. For example, eight sub-frames may be provided so as to perform 8-bit gradation.

Operation in one frame will be described. First, writing operation is sequentially performed for each of the first line to the last line in the sub-frame 501. Accordingly, starting time of the writing period depends on lines. Lines of which the writing periods 501$a$ are completed are sequentially moved into the retention periods 501$b$. In the retention period 501$b$, a light-emitting element which is given a signal for emitting light is made to be into an emitting state. Further, lines of which the retention periods 501$b$ are completed are sequentially moved into the next sub-frames 502, and writing operation is sequentially performed for each of the first line to the last line as in the case of the sub-frame 501. The operation described above is repeated to complete up to the retention period 504$b$ of the sub-frame 504. When the operation in the sub-frame 504 is completed, the line is moved into the next frame. Thus, the total time of emitting light in each sub-frame is emission time of each light-emitting element in one frame. By varying this emission time with respect to each light-emitting element and combining variously the emission time in one pixel, various different display colors in luminosity and chromaticity can be made.

As in the sub-frame 504, before writing up to the last line is completed, when it is required that a retention period is forcibly terminated in lines where writing is finished and which is moved into the retention period it is preferable that an erasing period 504$c$ be provided after the retention period 504$b$ and a line be controlled so as to be forcibly into a non-emitting state. Further, the line made forcibly to be in the non-emitting state is kept the non-emitting state for a certain period (this period is referred to as a non-emission period 504$d$). Then, immediately after the writing period of the last line is completed, the lines are sequentially moved into the next writing period (or the next frame) from the first line. This makes it possible to prevent the writing period of the sub-frame 504 from overlapping with the writing period of the next sub-frame.

Although the sub-frames 501 to 504 are arranged in the order of retention period from longest to shortest in this embodiment, the arrangement as in this embodiment is not always necessary. For example, the sub-frames 501 to 504 may be arranged in the order of retention period from shortest to longest or may be arranged in random order. In addition, the sub-frames may be divided further into a plurality of frames. Namely, scanning of the gate signal lines may be performed at a plurality of times while giving the same image signal.

Hereinafter, operation of the circuit shown in FIG. 9 in a writing period and an erasing period will be described.

First, operation in a writing period will be described. In the writing period, the n-th (n is a natural number) gate signal line 911 is electrically connected to the writing gate signal line driver circuit 913 via the switch 918, and unconnected to the erasing gate signal line driver circuit 914. In addition, the source signal line 912 is electrically connected to the source signal line driver circuit 915 via the switch 920. At this time, a signal is input to the gate of the first transistor 901 connected to the n-th (n is a natural number) gate signal line 911 to turn on the first transistor 901. Then, image signals are input simultaneously to the first to last source signal lines 912. It is to be noted that the image signals input from the source signal lines 912 at each columns are independent from each other. The image signal input from the source signal lines 912 is input to the gate electrode of the second transistor 902 via the first transistor 901 connected to each the source signal line. At this moment, the value of current to be supplied from the current supply line 917 to the light-emitting element 903 is determined in accordance with the signal input to the second transistor 902. Then, whether the light-emitting element 903 emits light or not is determined depending on the value of the current. For example, in the case that the second transistor 902 is a p-channel transistor, the light-emitting element 903 is made to emit light by inputting a Low Level signal to the gate electrode of the second transistor 902. On the other hand, in the case that the second transistor 902 is an n-channel transistor, the light-emitting element 903 is made to emit light by inputting a High Level signal to the gate electrode of the second transistor 902.

Next, operation in an erasing period will be described. In the erasing period, the n-th (n is a natural number) gate signal line 911 is electrically connected to the erasing gate signal line driver circuit 914 via the switch 919. In addition, the source signal line 912 is electrically connected to the power source 916 via the switch 920. In this case, a signal is input to the gate of the first transistor 901 connected to the n-th (n is a natural number) gate signal line 911 to turn on the first transistor 901. Then, at this moment, erasing signals are input simultaneously to the first to last source signal lines. The erasing signal input from each of the source signal lines 912 is input to the gate electrode of the second transistor 902 via the first transistor 901 connected to the source signal line 912. At this moment, current supply from the current supply line 917 to the light-emitting element 903 is stopped in accordance with the signal input to the second transistor 902. Then, the light-emitting element 903 is forcibly made to be into a non-emitting state. For example, in the case that the second transistor 902 is a p-channel transistor, the light-emitting element 903 is made not to emit light emitted light by inputting a High Level signal to the gate electrode of the second transistor 902. On the other hand, in the case that the second transistor 902 is an n-channel transistor, the light-emitting element 903 is made not to emit light by inputting a Low Level signal to the gate electrode of the second transistor 902.

As for the n-th line (n is a natural number), signals for erasing are input by the operation as described above in an erasing period. However, as described above, the other line (referred to as the m-th line (m is a natural number)) may be a writing period and the n-th line may be an erasing period. In such a case, it is necessary to input a signal for erasing to the n-th line and input a signal for writing to the m-th line by using the source signal line in the same columns. Therefore, operation described below is preferably carried out.

Immediately after the n-th light-emitting element 903 is made not to emit light by the operation in the erasing period described above, the gate signal line 911 and the erasing gate signal line driver circuit 914 are made to be unconnected to each other, and the switch 920 is switched to connect the source signal line 912 and the source signal line driver circuit 915. Then, the source signal line 912 is connected to the source signal line driver circuit 915, simultaneously; the gate signal line 911 is connected to the writing gate signal line driver circuit 913. Then, a signal is input selectively to the m-th gate signal line 911 from the writing gate signal line driver circuit 913 to turn on the first transistor 901, and signals for writing are input to the first to last source signal lines from the source signal line driver circuit 915. This signal makes the m-th light-emitting element 903 is made to emit light or not to emit light.

Immediately after the writing period for the m-th line is completed as described above, an erasing period for the (n+1)-th line is started. For that purpose, the gate signal line 911 and the writing gate signal line driver circuit 913 are made to be unconnected to each other, and the switch 920 is switched to connect the source signal line and the power source 916. Further, the gate signal line 911 is made to be unconnected to the writing gate signal line driver circuit 913, simultaneously; the gate signal line 911 is made to be connected to the erasing gate signal line driver circuit 914. Then, a signal is input selectively to the (n+1)-th gate signal line 911 from the erasing gate signal line driver circuit 914 to turn on the first transistor 901, simultaneously; an erasing signal is input from the power source 916. Immediately after the erasing period for the (n+1)-th line is completed, a writing period for the (m+1)-th line is started. Then, an erasing period and a writing period may be repeated in the same way until an erasing period for the last line is completed.

Although the example in which the writing period for the m-th line is provided between the erasing period for the n-th line and the erasing period for the (n+1)-th line is described in this embodiment, the present invention is not limited thereto. The writing period for the m-th line may be provided between an erasing period for (n−1)-th line and an erasing period for n-th line.

In this embodiment, the operation that the erasing gate signal line driver circuit 914 and a certain gate signal line 911 are made to be unconnected to each other and the writing gate signal line driver circuit 913 and the other gate signal line 911 are made to be connected to each other is repeated when the non-emission period 504d is provided in the sub-frame 504. This type of operation may be performed in a frame in which a non-emission period is not particularly provided.

Embodiment 4

An electric appliance which includes a semiconductor device manufactured by applying a manufacturing method of the semiconductor device according to the present invention and which includes a light-emitting device or the like operating by the semiconductor device is explained. The electric appliance applied with the present invention hardly has operating deterioration of a semiconductor device due to etching and achieves favorable images.

Figure 12A:
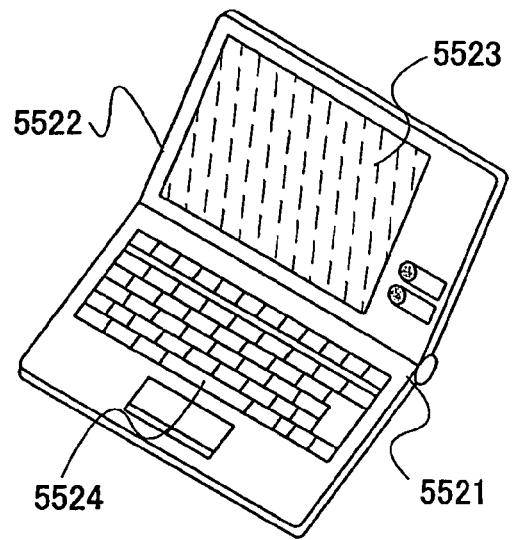
FIGS. 12A to 12C are explanatory views for showing electric appliances to which the present invention is applied.
Figure 12B:
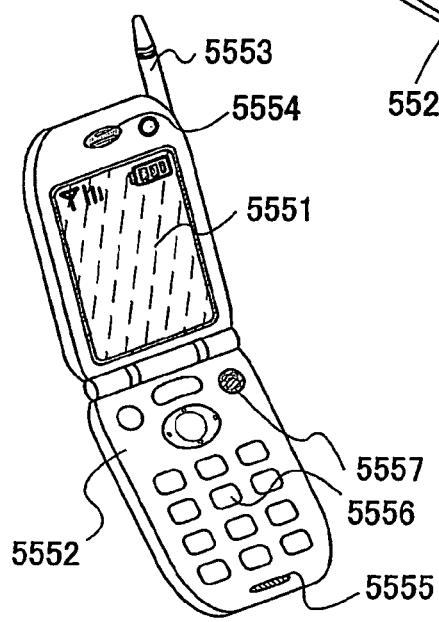
Figure 12C:
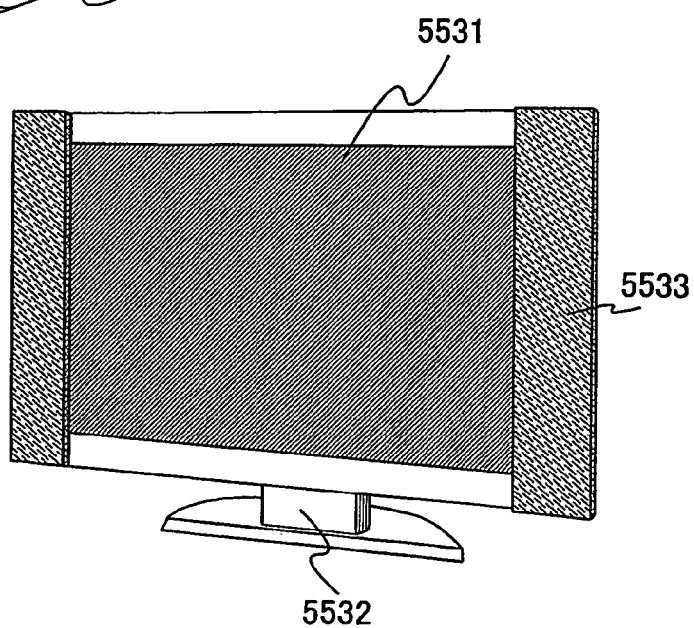

FIG. 12A, FIG. 12B, and FIG. 12C show one embodiment of an electric appliance mounted with a light-emitting device to which the present invention is applied.

FIG. 12A shows a laptop personal computer manufactured by applying the present invention. The laptop personal computer is composed of a main body 5521, a housing 5522, a display portion 5523, a key board 5524, and the like. The personal computer can be completed by incorporating a light-emitting device manufactured by applying the manufacturing method of the semiconductor device according to the present invention as a display portion.

FIG. 12B shows a telephone manufactured by applying the present invention. A main body 5552 of the telephone is composed of a display portion 5551, a voice output portion 5554, a voice input portion 5555, operating switches 5556, 5557, an antenna 5553, and the like. The telephone can be completed by incorporating a light-emitting device manufactured by applying the manufacturing method of the semiconductor device according to the present invention as a display portion.

FIG. 12C is a television manufactured by applying the present invention. The television is composed of a display portion 5531, a housing 5532, a speaker 5533, and the like. The television can be completed by incorporating a light-emitting device manufactured by applying the manufacturing method of the semiconductor device according to the present invention as a display portion.

The light-emitting device according to the present invention is greatly suitable for a display portion of various kinds of electric appliance.

This embodiment describes a personal computer; however, the light-emitting device manufactured by using the manufacturing method of the semiconductor device can be mounted to a telephone, a navigation device, a lighting system, and the like.

Example 1

In Example 1, a result of an experiment on an advantageous effect of the present invention is explained.

Figure 13A:
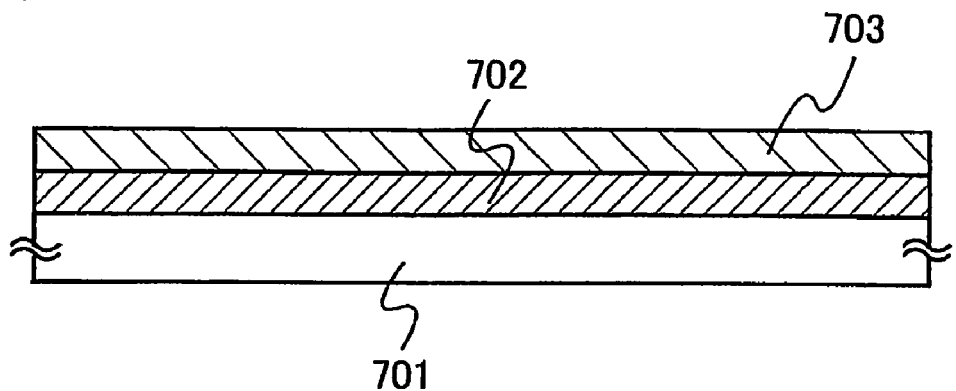
FIGS. 13A to 13C are explanatory views for showing an experiment for investigating an advantageous effect of the present invention.
Figure 13B:
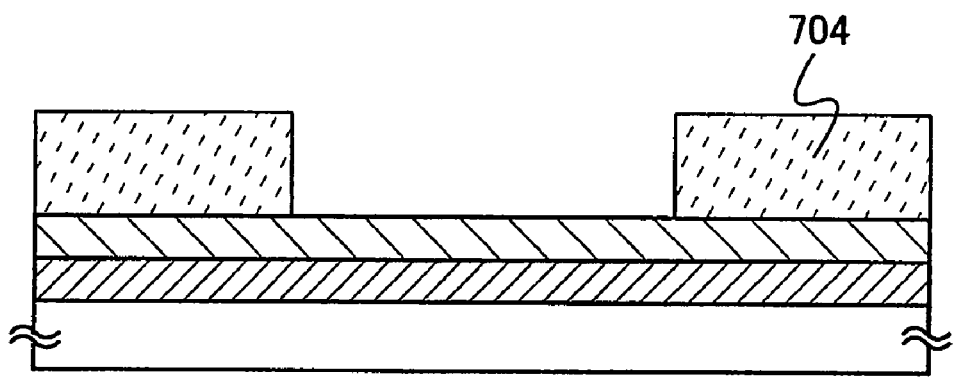
Figure 13C:
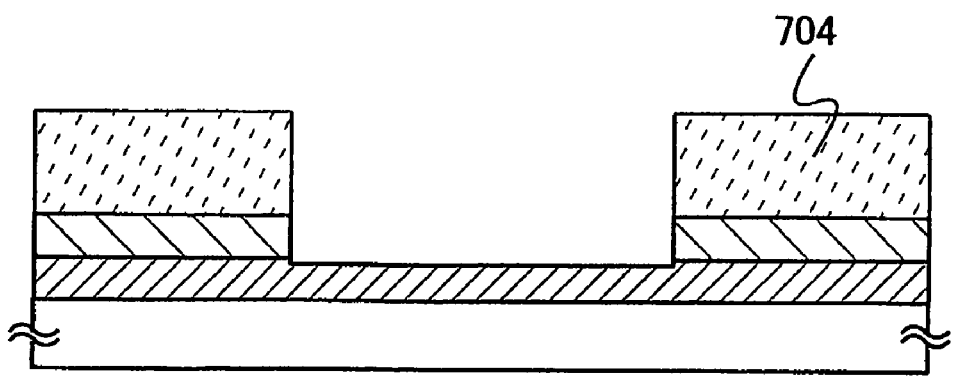

A sample employed for the experiment is composed of a substrate 701, a conductive layer 702 over the substrate 701, an insulating layer 703 over the conductive layer 702 as shown in FIGS. 13A to 13C. The conductive layer 702 includes titanium. The insulating layer 703 includes siloxane. The glass substrate 701 is made from glass. A plurality of samples having common structures was prepared.

The experiment was carried out as follows. A mask 704 including resist was formed over the insulating layer 703. Each sample was processed under the condition by which the insulating layer 703 can be selectively etched. The etching was performed under different conditions (conditions 1 to 12) with respect to each sample. The processing time of etching in any of the conditions was one minute. Each condition was represented in Table 1. After etching the insulating layer 703, a thickness of the conductive layer 702 which is etched with the insulating layer 703 was obtained to obtain a selective ratio. The selective ratio is the value which was obtained by dividing an etching rate for the insulating layer 703 by an etching rate for the conductive layer 702. When the selective ratio is large, the insulating layer 703 can be selectively etched and the conductive layer 702 can be prevented from being over etched.

TABLE 1

| No. | etching condition | | | | | | | | se-lective ratio |
|---|---|---|---|---|---|---|---|---|---|
| | ICP (W) | Bias (W) | Pressure (Pa) | flow (sccm) | | | | | |
| | | | | Cl2 | CF4 | HBr | O2 | SF6 | |
| 1 | 500 | 75 | 2 | 100 | 15 | — | 15 | | x |
| 2 | 500 | 250 | 2 | 100 | 15 | — | 15 | | x |
| 3 | 500 | 50 | 1.7 | 50 | — | 75 | 5 | | 32.7 |
| 4 | 500 | 200 | 1.7 | 50 | — | 75 | 5 | | 1.3 |
| 5 | 500 | 50 | 1.7 | 75 | — | 50 | 5 | | 24.7 |
| 6 | 500 | 200 | 1.7 | 75 | — | 50 | 5 | | x |
| 7 | 500 | 50 | 1.7 | 100 | — | 25 | 5 | | 28.8 |
| 8 | 500 | 200 | 1.7 | 100 | — | 25 | 5 | | x |
| 9 | 500 | 50 | 1.7 | — | — | 125 | 5 | | 3.7 |
| 10 | 500 | 200 | 1.7 | — | — | 125 | 5 | | 3.2 |
| 11 | 500 | 100 | 1.7 | — | — | 125 | 5 | 10 | 78.5 |
| 12 | 500 | 250 | 1.5 | — | 15 | 100 | 15 | | 117.2 |
| 13 | 500 | 250 | 2 | — | 15 | 100 | 15 | | 31.8 |

"x" means that selective ratio can not be obtained due to disappearance of the insulating layer.

Table 1 shows that the insulating layer 703 can be selectively etched under the condition of including an HBr gas. By including a $CF_4$ gas, $SF_6$ gas, or the like in addition to the HBr gas, the selective ratio for the insulating layer 703 is increased.

Figure 14A:
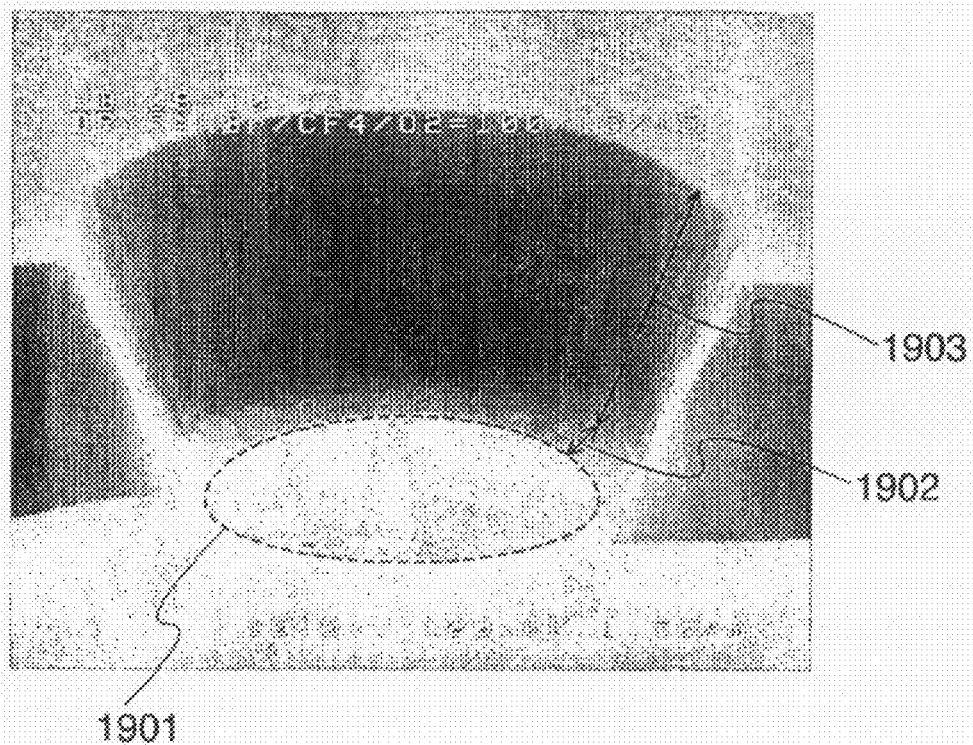
FIGS. 14A and 14B are views for showing images obtained by observation with a scanning electron microscopy.
Figure 14B:
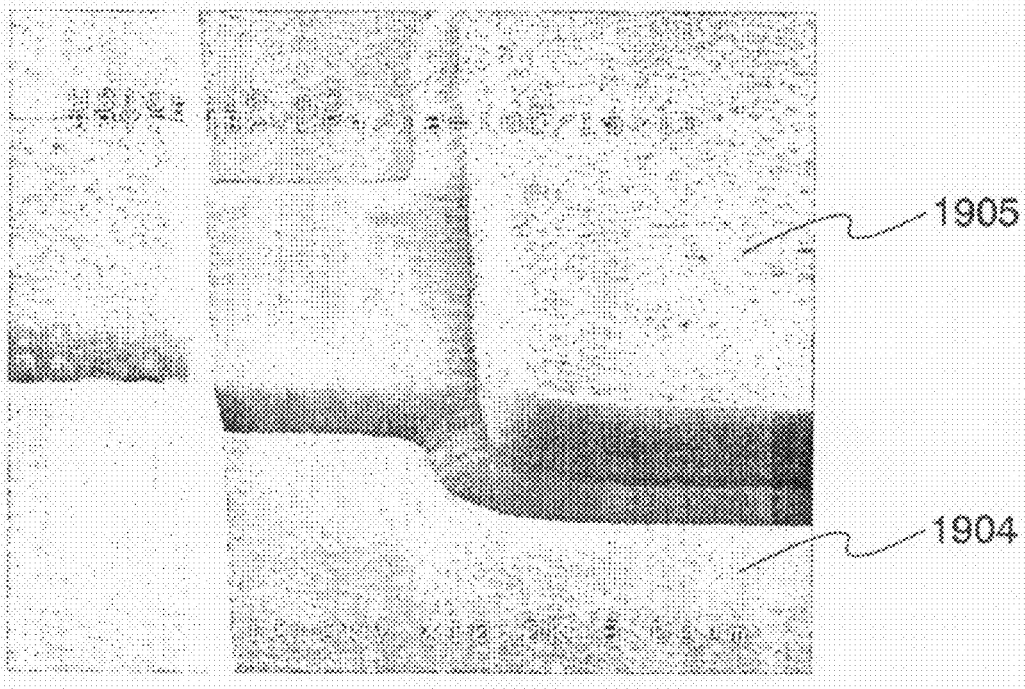

An observation result with a scanning electron microscopy shows that residue caused by siloxane can be suppressed by adjusting so that pressure is less than 2 Pa, preferably, 1.7 Pa or less. FIGS. 14A and 14B show images obtained by observing a sample processed under the condition 12 in Table 1 (different sample than that used for the foregoing experiment) with the scanning electron microscopy. FIG. 14A is an observed image of an opening portion provided to connect wirings to each other (a portion corresponding to the opening portion shown in FIG. 5B). FIG. 14B is an observed image of a region where an insulating layer is etched to expose a wiring (a region corresponding to the wiring region 203 shown in FIG. 5B). In FIG. 14A, a wiring is exposed to an opening portion (a portion indicated by a dotted line 1901) of an insulating layer 1902 formed by stacking a silicon oxide layer including nitrogen and a layer including siloxane. The wiring is formed by stacking sequentially a layer including titanium, a layer including aluminum, and a layer including titanium. In FIG. 14A, a layer including titanium provided at the side of a top layer can be confirmed. A resist 1903 can be confirmed used as a mask can be confirmed over the insulating layer 1902. In FIG. 14B, a wiring 1905 can be confirmed over the insulating layer 1904. The wiring 1905 is formed simultaneously with the wiring exposed to the opening portion of the insulating layer 1902. An insulating layer 1904 is formed to insulate the wiring 1905 from a wiring formed beneath the insulating layer 1904. The insulating layer 1904 has steps due to the shape of the wiring formed beneath the insulating layer 1904. FIGS. 14A and 14B shows that the sample etched by applying the present invention has no residue and in a favorable state.

EXPLANATION OF REFERENCE

301: conductive layer; 302: insulating layer; 303: mask; 100: substrate; 101*a*: insulating layer; 101*b*: insulating layer; 102: semiconductor layer; 103: semiconductor layer; 104: semiconductor layer; 105: semiconductor layer; 106: semiconductor layer; 107: gate insulating layer; 108: first conductive layer; 109: second conductive layer; 110*a*: mask; 110*b*: mask; 110*c*: mask; 110*d*: mask; 110*e*: mask; 110*f*: mask; 111:

second conductive layer; 112: second conductive layer; 113: second conductive layer; 114: second conductive layer; 115: second conductive layer; 116: second conductive layer; 117: electrode; 118: electrode; 121: first conductive layer; 122: first conductive layer; 123: first conductive layer; 124: first conductive layer; 125: first conductive layer; 126: first conductive layer; 127: electrode; 128: electrode; 129: electrode; 130: connecting portion; 131: second conductive layer; 132: second conductive layer; 133: second conductive layer; 134: second conductive layer; 135: second conductive layer; 136: second conductive layer; 140*a*: first n-type impurity region; 140*b*: first n-type impurity region; 141*a*: first n-type impurity region; 141*b*: first n-type impurity region; 142*a*: first n-type impurity region; 142*b*: first n-type impurity region; 142*c*: first n-type impurity region; 143*a*: first n-type impurity region; 143*b*: first n-type impurity region; 144*a*: first n-type impurity region; 144*b*: second n-type impurity region; 147*a*: second n-type impurity region; 147*b*: second n-type impurity region; 147*c*: second n-type impurity region; 145*a*: third n-type impurity region; 145*b*: third n-type impurity region; 146: channel region; 148*a*: third n-type impurity region; 148*b*: third n-type impurity region; 148*c*: third n-type impurity region; 148*d*: third n-type impurity region; 153*a*: mask; 153*b*: mask; 153*c*: mask; 153*d*: mask; 155*a*: mask; 155*b*: mask; 156: wiring; 160*a*: first p-type impurity region; 160*b*: first p-type impurity region; 161*a*: second p-type impurity region; 161*b*: second p-type impurity region; 163*a*: first p-type impurity region; 163*b*: first p-type impurity region; 164*a*: second p-type impurity region; 164*b*: second p-type impurity region; 167: first insulating layer; 168: second insulating layer; 169*a*: connecting portion; 169*b*: connecting portion; 170*a*: connecting portion; 170*a*: connecting portion; 171*b*: connecting portion; 172*a*: connecting portion; 172*b*: connecting portion; 173: transistor; 174: transistor; 175: transistor; 176: transistor; 178: connecting portion; 179*a*: wiring; 179*b*: wiring; 180: insulating layer; 181: insulating layer; 182: opening portion; 183: opening portion; 184: opening portion; 185: electrode; 186: bank layer; 188: light-emitting layer; 189: electrode; 191: protective layer; 192: sealant; 194: flexible printed circuit; 195: substrate; 202: external connecting region; 203: wiring region; 204: driving circuit region; 206: pixel region; 6500: substrate; 6503: FPC; 6504: printed wiring board (PWB); 6511: pixel portion; 6512: source signal line driver circuit; 6513: writing gate signal line driver circuit; 6514: erasing gate signal line driver circuit; 901: transistor; 902: transistor; 903: light-emitting element; 911: gate signal line; 913: writing gate signal line driver circuit; 914: erasing gate signal line driver circuit; 915: source signal line driver circuit; 916: power source; 917: current supply line; 918: switch; 919: switch; 920: switch; 1001: transistor, 1002: transistor; 1003: gate signal line; 1004: source signal line; 1005: current supply line; 1006: power source; 501: sub-frame; 502: sub-frame; 503: sub-frame; 504: sub-frame; 501*a*: writing period; 502*a*: writing period; 503*a*: writing period; 504*a*: writing period; 501*b*: retention period; 502*b*: retention period; 503*b*: retention period; 504*b*: retention period; 504*c*: erasing period; 504*d*: non-emission period; 5521: main body; 5522: housing; 5523: display portion; 5524: key board; 5551: display portion; 5552: main body; 5553: antenna; 5554: voice output portion; 5555: voice input portion; 5556: operation switches; 5531: display portion; 5532: housing; 5533: speaker; 701: substrate; 702: conductive layer; 703: insulating layer; 704: mask; 1901: dotted line; 1902: insulating layer; 1903: resist; 1904: insulating layer; and 1905: wiring

The invention claimed is:

1. A method for manufacturing a semiconductor device comprising:
   forming a first conductive layer in a pixel region and a second conductive layer having a stepped portion in a driver circuit region;
   forming an insulating layer including siloxane over the first conductive layer and the second conductive layer;
   etching the insulating layer with a gas including hydrogen bromide in order to form a first opening in the pixel region and a second opening in the driver circuit region,
   wherein the first opening exposes at least a part of the first conductive layer,
   wherein the stepped portion includes an upper top surface of the conductive layer and a lower top surface of the conductive layer, and
   wherein the second opening exposes a part of the upper top surface and a part of the lower top surface.

2. The method for manufacturing a semiconductor device according to claim 1, wherein the conductive layer includes one or two kinds of metal selected from the group consisting of titanium, aluminum, and molybdenum.

3. The method for manufacturing a semiconductor device according to claim 1, wherein the gas includes one or two gases selected from an oxygen gas, a carbon tetrafluoride gas, and a sulfur hexafluoride gas.

4. The method for manufacturing a semiconductor device according to claim 1, wherein the etching is carried out at a pressure of less than 2 Pa.

5. The method for manufacturing a semiconductor device according to claim 1, wherein the insulating layer is formed by coating method or ink-jetting method.

6. A method for manufacturing a semiconductor device comprising:
   forming a thin film transistor in a pixel region over a substrate;
   forming a first insulating layer over the thin film transistor;
   forming a first conductive layer in the pixel region and a second conductive layer in a driver circuit region over the first insulating layer, the first conductive layer being electrically connected to the thin film transistor;
   forming a second insulating layer including siloxane over the first conductive layer and the second conductive layer;
   forming a first opening in the pixel region and a second opening in the driver circuit region by etching the second insulating layer with a gas including hydrogen bromide,
   wherein the first opening exposes at least a part of the first conductive layer,
   wherein the second conductive layer has a stepped portion,
   wherein the stepped portion includes an upper top surface of the second conductive layer and a lower top surface of the second conductive layer, and
   wherein the second opening exposes at least a part of the upper top surface and a part of the lower top surface.

7. The method for manufacturing a semiconductor device according to claim 6, wherein the etching step is performed by using a mask which is formed over the second insulating layer.

8. The method for manufacturing a semiconductor device according to claim 6, wherein the part of the first conductive layer and the part of the second conductive layer are exposed in the etching step.

9. The method for manufacturing a semiconductor device according to claim 6, wherein the first conductive layer and the second conductive layer include one or two kinds of metal selected from the group consisting of titanium, aluminum, and molybdenum.

10. The method for manufacturing a semiconductor device according to claim 6, wherein the gas includes one or two gases selected from an oxygen gas, a carbon tetrafluoride gas, and a sulfur hexafluoride gas.

11. The method for manufacturing a semiconductor device according to claim 6, wherein the etching is carried out at a pressure of less than 2 Pa.

12. The method for manufacturing a semiconductor device according to claim 6, wherein the second insulating layer is formed by coating method or ink-jetting method.

13. The method for manufacturing a semiconductor device according to claim 1, wherein a selective ratio of the insulating layer including siloxane with respect to the conductive layer is 20 or more in the etching.

14. The method for manufacturing a semiconductor device according to claim 1, wherein a selective ratio of the insulating layer including siloxane with respect to the conductive layer is 70 or more in the etching.

15. The method for manufacturing a semiconductor device according to claim 6, wherein a selective ratio of the second insulating layer including siloxane with respect to the first conductive layer is 20 or more in the etching.

16. The method for manufacturing a semiconductor device according to claim 6, wherein a selective ratio of the second insulating layer including siloxane with respect to the first conductive layer is 70 or more in the etching.

17. The method for manufacturing a semiconductor device according to claim 6, further comprising:
forming a pixel electrode electrically connected to the first conductive layer through the first opening.

* * * * *